United States Patent
Yamamoto et al.

(10) Patent No.: US 7,824,934 B2
(45) Date of Patent: Nov. 2, 2010

(54) SUBSTRATE PROCESSING APPARATUS, PARAMETER MANAGEMENT SYSTEM FOR SUBSTRATE PROCESSING APPARATUS, PARAMETER MANAGEMENT METHOD FOR SUBSTRATE PROCESSING APPARATUS, PROGRAM, AND STORAGE MEDIUM

(75) Inventors: Yoshihiro Yamamoto, Miyagi-gun (JP); Yoshiyuki Nakamura, Miyagi-gun (JP)

(73) Assignee: Tokyo Electron Limited, Tokyo (JP)

( * ) Notice: Subject to any disclaimer, the term of this patent is extended or adjusted under 35 U.S.C. 154(b) by 801 days.

(21) Appl. No.: 11/620,261

(22) Filed: Jan. 5, 2007

(65) Prior Publication Data
US 2007/0201156 A1 Aug. 30, 2007

Related U.S. Application Data

(60) Provisional application No. 60/780,377, filed on Mar. 9, 2006.

(30) Foreign Application Priority Data

Feb. 24, 2006 (JP) .............................. 2006-048475

(51) Int. Cl.
*H01L 21/66* (2006.01)
(52) U.S. Cl. ...................................................... 438/17
(58) Field of Classification Search ...................... None
See application file for complete search history.

(56) References Cited

U.S. PATENT DOCUMENTS

2005/0246127 A1 * 11/2005 Renken et al. .............. 702/117
2006/0134330 A1 * 6/2006 Ishikawa et al. .......... 427/248.1

FOREIGN PATENT DOCUMENTS

| JP | 10-125587 | 5/1998 |
| JP | 2000-228348 | 8/2000 |

* cited by examiner

*Primary Examiner*—Charles D Garber
*Assistant Examiner*—Andre' C Stevenson
(74) *Attorney, Agent, or Firm*—Oblon, Spivak, McClelland, Maier & Neustadt, L.L.P.

(57) ABSTRACT

A substrate processing apparatus which enables parameters for carrying out processing on substrates to be changed easily by a user. A storage device stores parameters that are for controlling the processing and are categorized into a plurality of categories. A control device carries out the processing on the substrate based on the parameters. A parameter changing device enables each of the parameters to be changed in accordance with the category of that parameter. A parameter category changing device changes the category of some of the parameters. A category change defining device is detachable from the substrate processing apparatus and specifies parameters whose category is to be changed out of the parameters. The parameter category changing device changes the category of each of the parameters specified by the category change defining device.

13 Claims, 18 Drawing Sheets

FIG. 7

⟨PARAMETER DEFINITION FILE⟩

• PARAMETER DEFINITION FILE NAME

- GPID
- CATEGORY DATA
- TEXT DATA
- CHOICE DATA

- GPID
- CATEGORY DATA
- TEXT DATA
- CHOICE DATA

| ITEM NAME | | |
|---|---|---|
| 4 ARAM STATE FORCED CHANGE | OFF | |
| 3 PAC RECIPE INFORM TIME-OUT [SEC] | 10 | |
| 3 OPERATION DURING PAC RECIPE BEING UNINFORMED | STOP | CATEGORY 1 SO CANNOT BE CHANGED |
| 1 CONSTRUCTION OF ORIENTER | SDK ORT | |
| 2 DECIMAL POINT-DISPLAY OF LOT DATA OF PROCESS LOG | OFF | |
| 1 EPD GRAPH SCREEN RECIPE SKIP/STOP OPERATION | TWO ACTION | |
| 0 ENERGY SAVING FUNCTION DURING IDLING | ON | |
| 3 FOUP DETECTING TYPE SETTING AT AUTO MODE | Type1 (Normal) | |
| 0 RECIPE STEP NUMBER EXTENDING FUNCTION | ON | |
| 4 TEST CARRIER-TO-HOST REQUIRING FUNCTION | OFF | |
| 1 WAFER ID RETRIEVING FUNCTION | OFF | |
| 4 WAFER ID MAXIMUM RETRIEVING NUMBER OF CASES | 500 | |
| 3 Completer CJ PROCESSING | HOLD | |
| 1 QC CHECKING FUNCTION | OFF | |
| 4 AUTO SETUP CARRIER AUTO Unload | OFF | |

SELECT SCREEN yyyy/mm/dd 00:00:00

FIG. 9

⟨CATEGORY CHANGE DEFINITION FILE⟩

- PARAMETER DEFINITION FILE NAME1
- GPID1
- GPID2
  ⋮
- GPIDm

- PARAMETER DEFINITION FILE NAME2
- GPID1
- GPID2
  ⋮
- GPIDn

⋮

- PARAMETER DEFINITION FILE NAMEp
- GPID1
- GPID2
  ⋮
- GPIDq

SUBSTRATE PROCESSING APPARATUS, PARAMETER MANAGEMENT SYSTEM FOR SUBSTRATE PROCESSING APPARATUS, PARAMETER MANAGEMENT METHOD FOR SUBSTRATE PROCESSING APPARATUS, PROGRAM, AND STORAGE MEDIUM

BACKGROUND OF THE INVENTION

1. Field of the Invention

The present invention relates to a substrate processing apparatus that carries out processing on substrates based on a plurality of parameters, and a parameter management system for the substrate processing apparatus, a parameter management method for the substrate processing apparatus, a program, and a storage medium, which enable the parameters to be changed.

2. Description of the Related Art

For a conventional substrate processing apparatus that carries out various types of processing on substrates, very many parameters are required for controlling the apparatus. These parameters are managed in the form of a database in the substrate processing apparatus. The various parts of the substrate processing apparatus are operated through data processing being carried out by software based on the parameters. When the version of the software is upgraded to a new version so that some functions can be added or changed in the substrate processing apparatus, parameters are also added or changed, and hence when the version of the software is upgraded, a conversion process (version upgrading process) for changing the parameter database from the old database to a new database is carried out.

If the parameters of the substrate processing apparatus are not set appropriately, then the apparatus may not operate properly, or may break down. Depending on the parameter type, for example for parameters that indicate valid ranges for processing conditions, a user may thus not be enabled to freely set the parameters via an operating unit of the apparatus, changing of the parameters instead being possible by using a parameter changing tool such as special software (see, for example, Japanese Laid-open Patent Publication (Kokai) No. H10-125587 and Japanese Laid-open Patent Publication (Kokai) No. 2000-228348).

However, to change parameters using such a parameter changing tool, it is necessary to carry out a procedure such as loading and executing the parameter changing tool on the apparatus, deleting the parameter changing tool after execution, and recording the contents of the parameter changes. As described above, there are very many parameters for a substrate processing apparatus, and yet the number of parameters that can be changed with one parameter changing tool is limited. A large number of parameter changing tools are thus required to upgrade the software version. The above procedure must thus be carried out many times.

In this way, for a conventional substrate processing apparatus, when parameters indicating valid ranges for processing conditions or the like are changed, the same procedure must be carried out repeatedly using special tools, and hence changing the parameters requires much time and effort, which is inefficient. Moreover mistakes are liable to be made during the procedure. Such mistakes may cause malfunctioning of the apparatus.

SUMMARY OF THE INVENTION

It is an object of the present invention to provide a substrate processing apparatus, a parameter management system for the substrate processing apparatus, a parameter management method for the substrate processing apparatus, a program, and a storage medium, that enable parameters for carrying out processing on substrates to be changed easily by a user.

To attain the above object, in a first aspect of the present invention, there is provided a substrate processing apparatus that carries out processing on a substrate, the substrate processing apparatus comprising: a storage device that stores parameters that are for controlling the processing and are categorized into a plurality of categories; a control device that carries out the processing on the substrate based on the parameters; a parameter changing device that enables each of the parameters to be changed in accordance with the category of that parameter; a parameter category changing device that changes the category of some of the parameters; and a category change defining device that is detachable from the substrate processing apparatus and specifies parameters whose category is to be changed out of the parameters, wherein the parameter category changing device changes the category of each of the parameters specified by the category change defining device.

With this arrangement, out of the parameters which are categorized into a plurality of categories, the category of each of the specified parameters is changed, and changing of each of the parameters is enabled in accordance with the category thereof. As a result, by specifying parameters having a category according to which the parameter cannot be changed, the category can be changed so as to make the parameter changeable. By specifying parameters having a category according to which the parameter cannot be changed, parameters for carrying out the processing on the substrate can thus easily be changed by a user. Moreover, because the user can easily change the parameters, the occurrence of mistakes in the parameter changing can be reduced, and hence malfunctioning of the substrate processing apparatus can be prevented.

Preferably, the parameter changing device enables changing of ones of the parameters having a predetermined category out of the plurality of categories, and the parameter category changing device changes the category of ones of the parameters having a category other than the predetermined category.

With this arrangement, changing of ones of the parameters having a predetermined category out of the plurality of categories is enabled, and the category of ones of the parameters having a category other than the predetermined category is changed to the predetermined category. As a result, by specifying parameters having a category other than the predetermined category, i.e. according to which the parameter cannot be changed, these parameters can be changed reliably.

Preferably, in response to the substrate processing device being restarted after the categories have been changed, the parameter category changing device restores each of the changed categories to an original category.

With this arrangement, when the substrate processing apparatus is restarted after the categories have been changed, each of the changed categories is restored to an original category. As a result, forgetting to restore the changed categories to the original categories can be prevented. The risk of parameters being changed can thus be reduced, and hence safety with regard to parameter changing can be strengthened.

Preferably, the apparatus further comprises a parameter category change prohibiting device that, in response to the parameter category changing device having changed the category of each of the parameters specified by the category change defining device, prohibits changing of the categories by the parameter category changing device.

According to the present invention, when the category of each of the specified parameters has been changed, changing of the parameter categories is prohibited. As a result, the category changing can be prevented from being carried out a second time on parameters whose category has been changed. Parameters that have become changeable can thus be prevented from becoming unchangeable again.

Preferably, the storage device stores parameter data indicating each of the parameters, and category data indicating the category for each of the parameters out of the plurality of categories, and the parameter category changing device has a copy storage device, copies and stores in the copy storage device the parameter data and the category data stored by the storage device, searches, from the copied parameter data, parameter data for the parameters specified by the category change defining device, and changes category data corresponding to the searched parameter data out of the copied category data so as to enable changing of the parameters, and, in response to the substrate processing device being restarted, deletes the data stored in the copy storage device so as to restore each of the changed categories to an original category.

With this arrangement, the parameter data and the category data stored in the storage apparatus are copied and stored in a copy storage apparatus, and parameter data for the specified parameters is searched from the copied parameter data. Then, category data corresponding to the searched parameter data out of the copied category data is changed so as to enable changing of the parameters, and moreover, when the substrate processing apparatus is restarted, the data stored in the copy storage apparatus is deleted so as to restore each of the changed categories to an original category. In this way, when the substrate processing apparatus is restarted after the categories have been changed so as to make parameters changeable, the changed categories are restored to the original categories. As a result, forgetting to restore the changed categories to the original categories can be prevented. The risk of parameters being changed can thus be reduced, and hence safety with regard to parameter changing can be strengthened.

Preferably, the storage device stores parameter data indicating each of the parameters, and category data indicating the category for each of the parameters out of the plurality of categories, and the parameter category changing device has a copy storage device, copies and stores in the copy storage device the parameter data and the category data stored by the storage device, searches, from the parameter data stored in the storage device, parameter data for the parameters specified by the category change defining device, and changes category data corresponding to the searched parameter data out of the category data stored in the storage device so as to enable changing of the parameters, and, in response to the substrate processing device being restarted, overwrites the data stored in the storage device with the data stored in the copy storage device so as to restore each of the changed categories to an original category.

According to the present invention, the parameter data and the category data stored in the storage apparatus are copied and stored in a copy storage apparatus, and parameter data for the specified parameters is searched from the parameter data stored in the storage apparatus. Then, category data corresponding to the searched parameter data out of the category data stored in the storage apparatus is changed so as to enable changing of the parameters, and moreover, when the substrate processing apparatus is restarted, the data stored in the storage apparatus is overwritten with the data stored in the copy storage apparatus so as to restore each of the changed categories to an original category. As a result, forgetting to restore the changed categories to the original categories can be prevented. The risk of parameters being changed can thus be reduced, and hence safety with regard to parameter changing can be strengthened.

Preferably, the parameter changing device has a user interface that enables the parameters to be changed by a user.

With this arrangement, a user can change the parameters via a user interface. As a result, the parameters that have become changeable through the category thereof being changed can easily be changed via the user interface.

Preferably, the category change defining device enables the specified parameters to be changed.

With this arrangement, specified parameters can be changed. As a result, the specified parameters can be made to be desired parameters. The user can thus freely select parameters that the user wishes to make changeable through the category thereof being changed, and hence the user can easily change the parameters.

To attain the above object, in a second aspect of the present invention, there is provided a parameter management method for a substrate processing apparatus comprising a storage device that stores parameters categorized into a plurality of categories, and a control device that carries out processing on a substrate based on the parameters, the parameter management method comprising: a category change defining step of specifying parameters whose category is to be changed out of the parameters; a parameter category changing step of changing the category of each of the parameters specified through the category change defining step; and a parameter changing step of enabling each of the parameters to be changed in accordance with the category of that parameter.

Preferably, the parameter changing step comprises enabling changing of ones of the parameters having a predetermined category out of the plurality of categories, and the parameter category changing step comprises changing the category of ones of the parameters having a category other than the predetermined category.

Preferably, in response to the substrate processing apparatus being restarted after the categories have been changed, the parameter category changing step comprises restoring each of the changed categories to an original category.

Preferably, the method further comprises a parameter category change prohibiting step of, in response to the category of each of the parameters specified through the category change defining step having been changed through the parameter category changing step, prohibiting changing of the categories through the parameter category changing step.

Preferably, the storage device stores parameter data indicating each of the parameters, and category data indicating the category for each of the parameters out of the plurality of categories, and the parameter category changing step comprises copying and storing in a copy storage device of the substrate processing apparatus the parameter data and the category data stored by the storage device, searching, from the copied parameter data, parameter data for the parameters specified through the category change defining step, and changing category data corresponding to the searched parameter data out of the copied category data so as to enable changing of the parameters, and, in response to the substrate processing apparatus being restarted, deleting the data stored in the copy storage device so as to restore each of the changed categories to an original category.

Preferably, the storage device stores parameter data indicating each of the parameters, and category data indicating the category for each of the parameters out of the plurality of categories, and the parameter category changing step comprises copying and storing in a copy storage device of the substrate processing apparatus the parameter data and the category data stored by the storage device, retrieving, from the parameter data stored in the storage device, parameter data for the parameters specified through the category change defining step, and changing category data corresponding to the searched parameter data out of the category data stored in the storage device so as to enable changing of the parameters, and, in response to the substrate processing apparatus being restarted, overwriting the data stored in the storage device with the data stored in the copy storage device so as to restore each of the changed categories to an original category.

Preferably, the parameter changing step comprises enabling the parameters to be changed via a user interface of the substrate processing apparatus.

Preferably, the category change defining step comprises enabling the specified parameters to be changed.

To attain the above object, in a third aspect of the present invention, there is provided a program for causing a computer to implement a parameter management method for a substrate processing apparatus comprising a storage device that stores parameters categorized into a plurality of categories, and a control device that carries out processing on a substrate based on the parameters, the program comprising: a category change defining module for specifying parameters whose category is to be changed out of the parameters; a parameter category changing module for changing the category of each of the parameters specified by the category change defining module; and a parameter changing module for enabling each of the parameters to be changed in accordance with the category of that parameter.

To attain the above object, in a fourth aspect of the present invention, there is provided a storage medium storing a program for causing a computer to implement a parameter management method for a substrate processing apparatus comprising a storage device that stores parameters categorized into a plurality of categories, and a control device that carries out processing on a substrate based on the parameters, the program comprising: a category change defining module for specifying parameters whose category is to be changed out of the parameters; a parameter category changing module for changing the category of each of the parameters specified by the category change defining module; and a parameter changing module for enabling each of the parameters to be changed in accordance with the category of that parameter.

To attain the above object, in a fifth aspect of the present invention, there is provided a parameter management system for a substrate processing apparatus comprising a storage device that stores parameters categorized into a plurality of categories, and a control device that carries out processing on a substrate based on the parameters, the parameter management system comprising: a category change defining device that is detachable from the substrate processing apparatus and specifies parameters whose category is to be changed out of the parameters, wherein the substrate processing apparatus comprises a parameter changing device that enables each of the parameters to be changed in accordance with the category of that parameter, and a parameter category changing device that changes the category of each of the parameters specified by the category change defining device.

To attain the above object, in a sixth aspect of the present invention, there is provided a parameter management system for a substrate processing apparatus comprising a storage device that stores parameters categorized into a plurality of categories, and a control device that carries out processing on a substrate based on the parameters, the parameter management system comprising a category change defining device that is detachable from the substrate processing apparatus and specifies parameters whose category is to be changed out of the parameters, wherein the substrate processing apparatus comprises a parameter changing device that enables each of the parameters to be changed in accordance with the category of that parameter, and a parameter category changing device that changes the category of each of the parameters specified by said category change defining device.

With this arrangement, parameters whose category is to be changed are specified by a category change defining apparatus that is detachable from the substrate processing apparatus, the category of each of the parameters specified by the category change defining apparatus is changed by the substrate processing apparatus, and changing of each of the parameters is enabled in accordance with the category of that parameter. As a result, by specifying parameters having a category according to which the parameter cannot be changed, the category can be changed so as to make the parameter changeable. In this way, by specifying parameters having a category according to which the parameter cannot be changed, a user can easily change the parameters. Moreover, because the user can easily change the parameters, the occurrence of mistakes in the parameter changing can be reduced, and hence malfunctioning of the substrate processing apparatus can be prevented.

To attain the above object, in a sixth aspect of the present invention, there is provided a substrate processing apparatus that carries out processing on a substrate, the substrate processing apparatus comprising: a storage device that stores parameters that are for controlling the processing and are categorized into a plurality of categories; a control device that carries out the processing on the substrate based on the parameters; a parameter changing device that enables each of the parameters to be changed in accordance with the category of that parameter; a parameter category changing device that changes the category of some of the parameters; and a category restoring device that, in response to the substrate processing apparatus being restarted, restores each of the categories that have been changed by said parameter category changing device to an original category.

With this arrangement, when the substrate processing apparatus is restarted, each of the changed categories is restored to an original category. As a result, forgetting to restore the changed categories to the original categories can be prevented. The risk of parameters being changed can thus be reduced, and hence safety with regard to parameter changing can be strengthened.

Other features and advantages of the present invention will be apparent from the following description taken in conjunction with the accompanying drawings, in which like reference characters indicate the same or similar parts throughout the figures thereof.

BRIEF DESCRIPTION OF THE DRAWINGS

The accompanying drawings, which are incorporated in and constitute a part of the specification, illustrate an embodiment of the present invention and, together with the description, serve to explain the principles of the present invention.

FIG. 7 is a drawing showing an example of a parameter definition file stored in a parameter definition file storage area appearing in FIG. 6;

FIG. 8 is a drawing showing an example of display of the parameter definition file shown in FIG. 7 on an operation controller;

FIG. 9 is a drawing showing an example of a category change definition file stored in an external storage medium appearing in FIG. 6;

DETAILED DESCRIPTION OF THE PREFERRED EMBODIMENTS

Preferred embodiments of the present invention will be described in detail below with reference to the drawings.

First, a substrate processing apparatus according to an embodiment of the present invention will be described.

Figure 1:
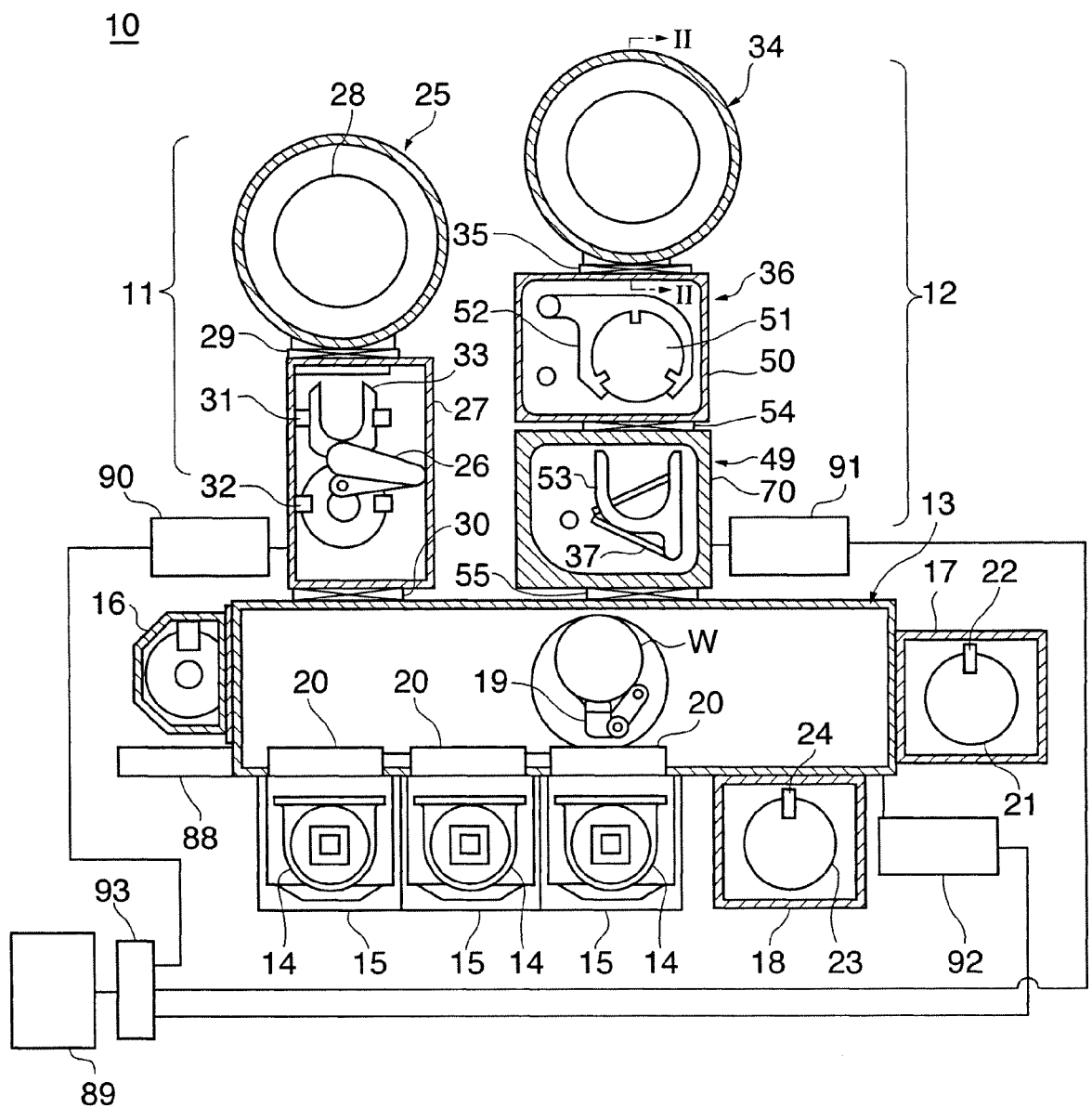
FIG. 1 is a plan view schematically showing the construction of a substrate processing apparatus according to an embodiment of the present invention.

FIG. 1 is a plan view schematically showing the construction of the substrate processing apparatus according to the present embodiment.

The substrate processing apparatus according to the present embodiment carries out RIE (reactive ion etching) processing or COR (chemical oxide removal) processing and PHT (post heat treatment) processing on wafers as substrates. The COR processing is processing in which an oxide film on an object to be processed is made to undergo chemical reaction with gas molecules (ammonia gas and hydrogen fluoride gas) to produce a product, and the PHT processing is processing in which the object to be processed that has been subjected to the COR processing is heated so as to vaporize/thermally oxidize the product that has been produced on the object to be processed through the chemical reaction in the COR processing, thus removing the product from the object to be processed. As described above, the COR processing and the PHT processing are, in particular the COR processing is, processing in which the oxide film on the object to be processed is removed without using plasma and without using water, and hence these are categorized as plasma-less etching processing or dry cleaning processing. Note that, other than etching processing, the present substrate processing apparatus can also be used as an apparatus for other processing such as CVD processing or thermal processing.

As shown in FIG. 1, the substrate processing apparatus 10 is comprised of a first process ship 11 for carrying out reactive ion etching (hereinafter referred to as "RIE") processing on electronic device wafers (hereinafter referred to merely as "wafers") (substrates) W, a second process ship 12 that is disposed parallel to the first process ship 11 and is for carrying out COR (chemical oxide removal) processing and PHT (post heat treatment) processing, described below, on the wafers W, and a loader unit 13, which is a rectangular common transfer chamber to which each of the first process ship 11 and the second process ship 12 is connected.

In addition to the first process ship 11 and the second process ship 12, the loader unit 13 has connected thereto three FOUP mounting stages 15 on each of which is mounted a FOUP (front opening unified pod) 14, which is a container housing twenty-five of the wafers W, an orienter 16 that carries out pre-alignment of the position of each wafer W transferred out from a FOUP 14, and first and second INS's (Integrated Metrology Systems, made by Therma-Wave, Inc.) 17 and 18 for measuring the surface state of each wafer W.

The first process ship 11 and the second process ship 12 are each connected to a side wall of the loader unit 13 in a longitudinal direction of the loader unit 13, disposed facing the three FOUP mounting stages 15 with the loader unit 13 therebetween. The orienter 16 is disposed at one end of the loader unit 13 in the longitudinal direction of the loader unit 13. The first IMS 17 is disposed at the other end of the loader unit 13 in the longitudinal direction of the loader unit 13. The second IMS 18 is disposed alongside the three FOUP mounting stages 15.

A SCARA-type dual arm transfer arm mechanism 19 for transferring the wafers W is disposed inside the loader unit 13, and three loading ports 20 through which the wafers W are introduced into the loader unit 13 are disposed in a side wall of the loader unit 13 in correspondence with the FOUP mounting stages 15. The transfer arm mechanism 19 removes a wafer W from a FOUP 14 mounted on a FOUP mounting stage 15 through the corresponding loading port 20, and transfers the removed wafer W into and out of the first process ship 11, the second process ship 12, the orienter 16, the first IMS 17, and the second IMS 18.

The first IMS 17 is an optical monitor having a mounting stage 21 on which is mounted a wafer W that has been transferred into the first IMS 17, and an optical sensor 22 that is directed at the wafer W mounted on the mounting stage 21. The first IMS 17 measures the surface shape of the wafer W, for example the thickness of a surface layer, and CD (critical dimension) values of wiring grooves, gate electrodes and so on. Like the first IMS 17, the second IMS 18 is also an optical monitor, and has a mounting stage 23 and an optical sensor 24. The second IMS 18 measures the number of particles on the surface of each wafer W.

The first process ship 11 has a first processing unit 25 as a first vacuum processing chamber in which the RIE processing is carried out on each wafer W, and a first load lock unit 27 containing a link-type single pick-type first transfer arm 26 for transferring each wafer W into and out of the first processing unit 25.

The first processing unit 25 has a cylindrical processing chamber (chamber), and an upper electrode and a lower electrode disposed in the chamber. The distance between the upper electrode and the lower electrode is set to an appropriate gap for carrying out the RIE processing on each wafer W.

Moreover, the lower electrode has in a top portion thereof an ESC 28 for chucking the wafer W thereto using a Coulomb force or the like.

In the first processing unit 25, a processing gas is introduced into the chamber and an electric field is generated between the upper electrode and the lower electrode, whereby the introduced processing gas is turned into plasma so as to produce ions and radicals. The wafer W is subjected to the RIE processing by the ions and radicals.

In the first process ship 11, the internal pressure of the first processing unit 25 is held at vacuum, whereas the internal pressure of the loader unit 13 is held at atmospheric pressure. The first load lock unit 27 is thus provided with a vacuum gate valve 29 in a connecting part between the first load lock unit 27 and the first processing unit 25, and an atmospheric gate valve 30 in a connecting part between the first load lock unit 27 and the loader unit 13, whereby the first load lock unit 27 is constructed as a preliminary vacuum transfer chamber whose internal pressure can be adjusted.

Within the first load lock unit 27, the first transfer arm 26 is disposed in an approximately central portion of the first load lock unit 27; first buffers 31 are disposed toward the first processing unit 25 with respect to the first transfer arm 26, and second buffers 32 are disposed toward the loader unit 13 with respect to the first transfer arm 26. The first buffers 31 and the second buffers 32 are disposed above a track along which a supporting portion (pick) 33 moves, the supporting portion 33 being disposed at the distal end of the first transfer arm 26 and being for supporting each wafer W. After having being subjected to the RIE processing, each wafer W is temporarily laid by above the track of the supporting portion 33, whereby swapping over of the wafer W that has been subjected to the RIE processing and a wafer W yet to be subjected to the RIE processing can be carried out smoothly in the first processing unit 25.

The second process ship 12 has a second processing unit 34 as a second vacuum processing chamber in which the COR processing is carried out on each wafer W, a third processing unit 36 as a third vacuum processing chamber that is connected to the second processing unit 34 via a vacuum gate valve 35 and in which the PHT processing is carried out on each wafer W, and a second load lock unit 49 containing a link-type single pick-type second transfer arm 37 for transferring each wafer W into and out of the second processing unit 34 and the third processing unit 36.

Figure 2A:
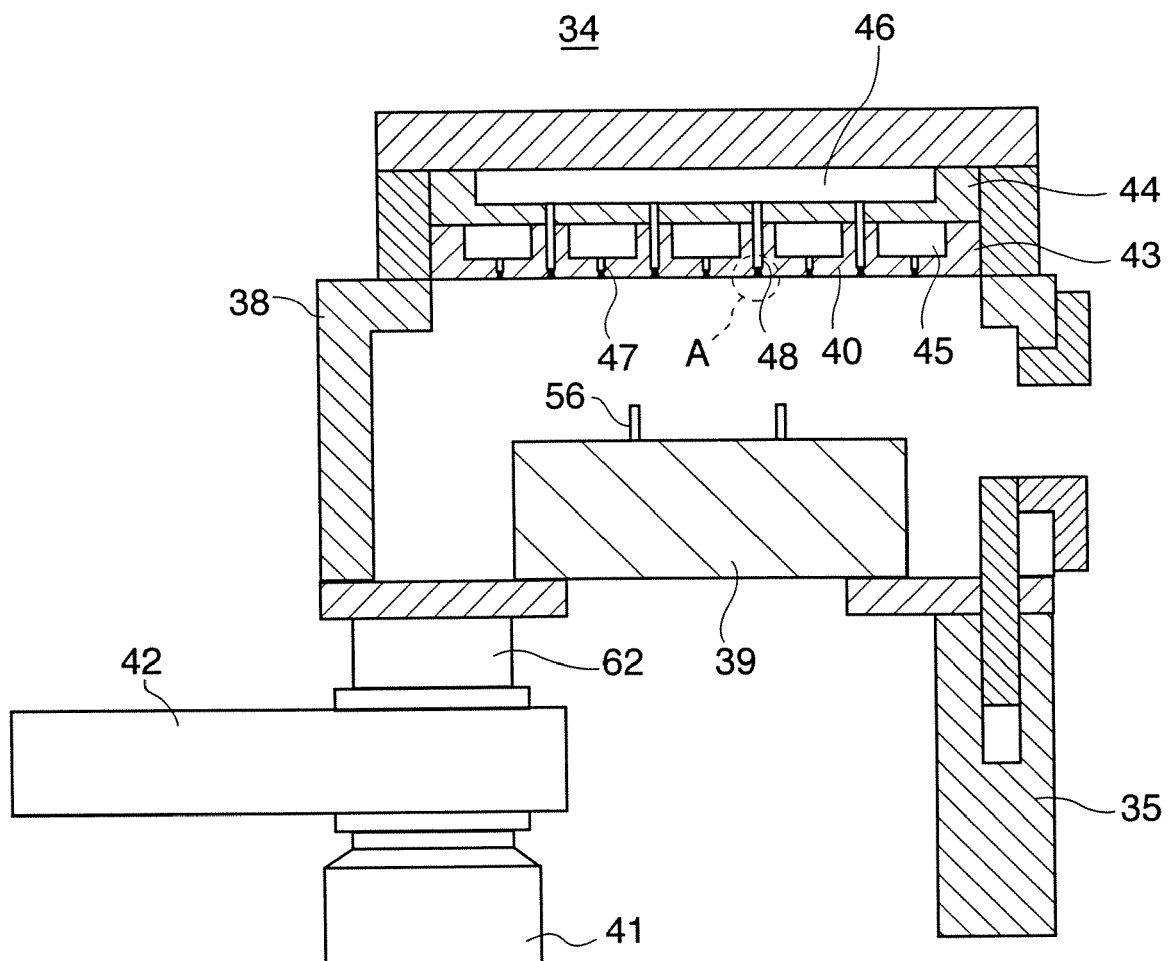
FIGS. 2A and 2B are sectional views of a second processing unit appearing in FIG. 1, FIG. 2A being a sectional view taken along line II-II in FIG. 1, and FIG. 2B being an enlarged view of a portion A shown in FIG. 2A.
Figure 2B:
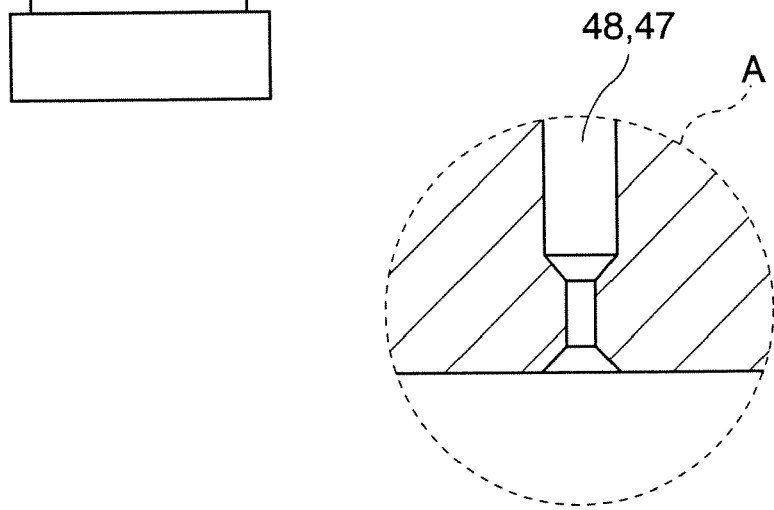

FIGS. 2A and 2B are sectional views of the second processing unit appearing in FIG. 1, FIG. 2A being a sectional view taken along line II-II in FIG. 1, and FIG. 2B being an enlarged view of a portion A shown in FIG. 2A.

As shown in FIG. 2A, the second processing unit 34 has a cylindrical processing chamber (chamber) 38, an ESC 39 as a wafer W mounting stage disposed in the chamber 38, a shower head 40 disposed above the chamber 38, a TMP (turbo molecular pump) 41 for exhausting gas out from the chamber 38, and an APC (automatic pressure control) valve 42 that is a variable valve disposed between the chamber 38 and the TMP 41 for controlling the pressure in the chamber 38.

The ESC 39 has therein an electrode plate (not shown) to which a DC voltage is applied. A wafer W is attracted to and held on the ESC 39 through a Johnsen-Rahbek force or a Coulomb force generated by the DC voltage. Moreover, the ESC 39 also has a coolant chamber (not shown) as a temperature adjusting mechanism. A coolant, for example cooling water or a Galden fluid, at a predetermined temperature is circulated through the coolant chamber. A processing temperature of the wafer W attracted to and held on an upper surface of the ESC 39 is controlled through the temperature of the coolant. Furthermore, the ESC 39 also has a heat-transmitting gas supply system (not shown) that supplies a heat-transmitting gas (helium gas) uniformly between the upper surface of the ESC 39 and a rear surface of the wafer W. The heat-transmitting gas carries out heat exchange between the wafer W and the ESC 39, which is held at a desired specified temperature by the coolant during the COR processing, thus cooling the wafer W efficiently and uniformly.

Moreover, the ESC 39 has a plurality of pusher pins 56 as lifting pins that can be made to project out from the upper surface of the ESC 39. The pusher pins 56 are housed inside the ESC 39 when a wafer W is attracted to and held on the ESC 39, and are made to project out from the upper surface of the ESC 39 so as to lift the wafer W up when the wafer W is to be transferred out from the chamber 38 after having been subjected to the COR processing.

The shower head 40 has a two-layer structure; a lower layer portion 43 and an upper layer portion 44 have first buffer chambers 45 and a second buffer chamber 46 therein respectively. The first buffer chambers 45 and the second buffer chamber 46 are communicated with the interior of the chamber 38 via gas-passing holes 47 and 48 respectively. That is, the shower head 40 is comprised of two plate-shaped members (the lower layer portion 43 and the upper layer portion 44) that are disposed on one another and have therein internal channels leading into the chamber 38 for gas supplied into the first buffer chambers 45 and the second buffer chamber 46.

When carrying out the COR processing on a wafer W, $NH_3$ (ammonia) gas is supplied into the first buffer chambers 45 from an ammonia gas supply pipe 57, described below, and the supplied ammonia gas is then supplied via the gas-passing holes 47 into the chamber 38, and moreover HF (hydrogen fluoride) gas is supplied into the second buffer chamber 46 from a hydrogen fluoride gas supply pipe 58, described below, and the supplied hydrogen fluoride gas is then supplied via the gas-passing holes 48 into the chamber 38.

Moreover, the shower head 40 also has a heater, for example a heating element, (not shown) built therein. The heating element is preferably disposed on the upper layer portion 44, for controlling the temperature of the hydrogen fluoride gas in the second buffer chamber 46.

Moreover, a portion of each of the gas-passing holes 47 and 48 where the gas-passing hole 47 or 48 opens out into the chamber 38 is formed so as to widen out toward an end thereof as shown in FIG. 2B. As a result, the ammonia gas and the hydrogen fluoride gas can be made to diffuse through the chamber 38 efficiently. Furthermore, each of the gas-passing holes 47 and 48 has a cross-sectional shape having a constriction therein. As a result, any deposit produced in the chamber 38 can be prevented from flowing back into the gas-passing holes 47 and 48, and thus the first buffer chambers 45 and the second buffer chamber 46. Alternatively, the gas-passing holes 47 and 48 may each have a spiral shape.

In the second processing unit 34, the COR processing is carried out on a wafer W by adjusting the pressure in the chamber 38 and the volumetric flow rate ratio between the ammonia gas and the hydrogen fluoride gas. Moreover, the second processing unit 34 is designed such that the ammonia gas and the hydrogen fluoride gas first mix with one another in the chamber 38 (post-mixing design), and hence the two gases are prevented from mixing together until they are introduced into the chamber 38, whereby the hydrogen fluoride gas and the ammonia gas are prevented from reacting with one another before being introduced into the chamber 38.

Moreover, in the second processing unit 34, a heater, for example a heating element, (not shown) is built into a side wall of the chamber 38, whereby the temperature of the atmosphere in the chamber 38 can be prevented from decreasing.

As a result, the reproducibility of the COR processing can be improved. Moreover, the heating element in the side wall also controls the temperature of the side wall, whereby by-products formed in the chamber 38 can be prevented from becoming attached to the inside of the side wall.

Returning to FIG. 1, the third processing unit 36 has a box-shaped processing chamber (chamber) 50, a stage heater 51 as a wafer W mounting stage disposed in the chamber 50, a buffer arm 52 that is disposed around the stage heater 51 and lifts up a wafer W mounted on the stage heater 51, and a PHT chamber lid (not shown) as an openable/closable lid that isolates the interior of the chamber from the external atmosphere.

The stage heater 51 is made of aluminum having an oxide film formed on a surface thereof, and heats the wafer W mounted thereon up to a predetermined temperature through heating wires or the like built therein. Specifically, the stage heater 51 directly heats the wafer W mounted thereon up to 100 to 200° C., preferably approximately 135° C., over at least 1 minute.

The PHT chamber lid has a sheet heater made of silicone rubber disposed thereon. Moreover, a cartridge heater (not shown) is built into a side wall of the chamber 50. The cartridge heater controls the wall surface temperature of the side wall of the chamber 50 to a temperature in a range of 25 to 80° C. As a result, by-products are prevented from becoming attached to the side wall of the chamber 50, whereby particles due to such attached by-products are prevented from arising, and hence the time period between one cleaning and the next of the chamber 50 can be extended. Moreover, an outer periphery of the chamber 50 is covered by a heat shield.

Instead of the sheet heater described above, a UV radiation heater may alternatively be provided as the heater for heating the wafer W from above. An example of such a UV radiation heater is a UV lamp that emits UV of wavelength 190 to 400 nm.

After being subjected to the COR processing, each wafer W is temporarily laid by above a track of a supporting portion 53 of the second transfer arm 37 by the buffer arm 52, whereby swapping over of wafers W in the second processing unit 34 and the third processing unit 36 can be carried out smoothly.

In the third processing unit 36, the PHT processing is carried out on each wafer W by adjusting the temperature of the wafer W.

The second load lock unit 49 has a box-shaped transfer chamber (chamber) 70 containing the second transfer arm 37. The internal pressure of each of the second processing unit 34 and the third processing unit 36 is held at vacuum, whereas the internal pressure of the loader unit 13 is held at atmospheric pressure. The second load lock unit 49 is thus provided with a vacuum gate valve 54 in a connecting part between the second load lock unit 49 and the third processing unit 36, and an atmospheric door valve 55 in a connecting part between the second load lock unit 49 and the loader unit 13, whereby the second load lock unit 49 is constructed as a preliminary vacuum transfer chamber whose internal pressure can be adjusted.

Figure 3:
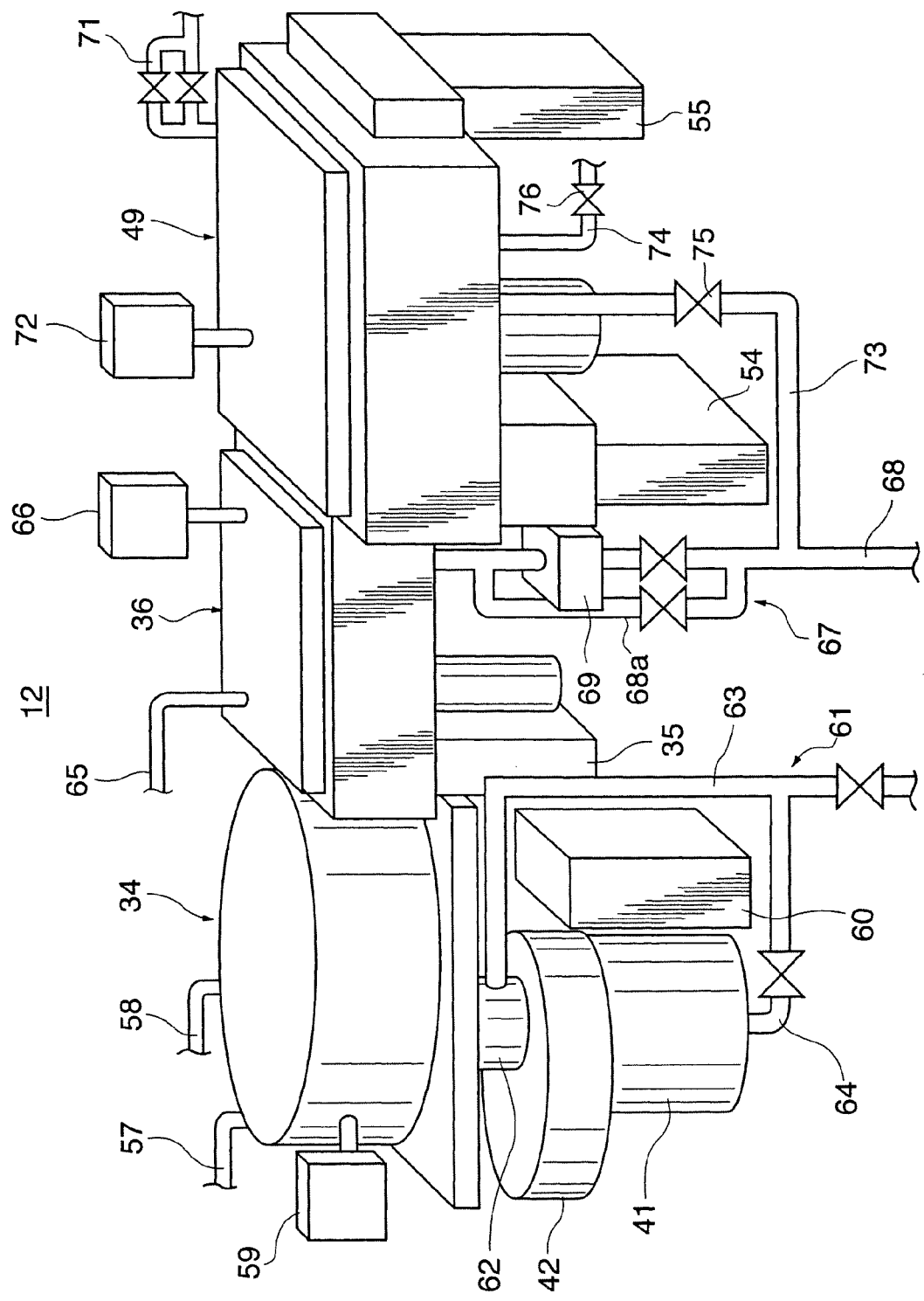
FIG. 3 is a perspective view schematically showing the construction of a second process ship appearing in FIG. 1.

FIG. 3 is a perspective view schematically showing the construction of the second process ship appearing in FIG. 1.

As shown in FIG. 3, the second processing unit 34 has the ammonia gas supply pipe 57 for supplying ammonia gas into the first buffer chambers 45, the hydrogen fluoride gas supply pipe 58 for supplying hydrogen fluoride gas into the second buffer chamber 46, a pressure gauge 59 for measuring the pressure in the chamber 38, and a chiller unit 60 that supplies a coolant into the cooling system provided in the ESC 39.

The ammonia gas supply pipe 57 has provided therein an MFC (mass flow controller) (not shown) for adjusting the flow rate of the ammonia gas supplied into the first buffer chambers 45, and the hydrogen fluoride gas supply pipe 58 has provided therein an MFC (not shown) for adjusting the flow rate of the hydrogen fluoride gas supplied into the second buffer chamber 46. The MFC in the ammonia gas supply pipe 57 and the MFC in the hydrogen fluoride gas supply pipe 58 operate collaboratively so as to adjust the volumetric flow rate ratio between the ammonia gas and the hydrogen fluoride gas supplied into the chamber 38.

Moreover, a second processing unit exhaust system 61 connected to a DP (dry pump) (not shown) is disposed below the second processing unit 34. The second processing unit exhaust system 61 is for exhausting gas out from the chamber 38, and has an exhaust pipe 63 that is communicated with an exhaust duct 62 provided between the chamber 38 and the APC valve 42, and an exhaust pipe 64 connected below (i.e. on the exhaust side) of the TMP 41. The exhaust pipe 64 is connected to the exhaust pipe 63 upstream of the DP.

The third processing unit 36 has a nitrogen gas supply pipe 65 for supplying nitrogen ($N_2$) gas into the chamber 50, a pressure gauge 66 for measuring the pressure in the chamber 50, and a third processing unit exhaust system 67 for exhausting the nitrogen gas out from the chamber 50.

The nitrogen gas supply pipe 65 has provided therein an MFC (not shown) for adjusting the flow rate of the nitrogen gas supplied into the chamber 50. The third processing unit exhaust system 67 has a main exhaust pipe 68 that is communicated with the chamber 50 and is connected to a DP, an APC valve 69 that is disposed part way along the main exhaust pipe 68, and an auxiliary exhaust pipe 68a that branches off from the main exhaust pipe 68 so as to bypass the APC valve 69 and is connected to the main exhaust pipe 68 upstream of the DP. The APC valve 69 controls the pressure in the chamber 50.

The second load lock unit 49 has a nitrogen gas supply pipe 71 for supplying nitrogen gas into the chamber 70, a pressure gauge 72 for measuring the pressure in the chamber 70, a second load lock unit exhaust system 73 for exhausting the nitrogen gas out from the chamber 70, and an external atmosphere communicating pipe 74 for releasing the interior of the chamber 70 to the external atmosphere.

The nitrogen gas supply pipe 71 has provided therein an MFC (not shown) for adjusting the flow rate of the nitrogen gas supplied into the chamber 70. The second load lock unit exhaust system 73 is comprised of a single exhaust pipe, which is communicated with the chamber 70 and is connected to the main exhaust pipe 68 of the third processing unit exhaust system 67 upstream of the DP. Moreover, the second load lock unit exhaust system 73 has an openable/closable exhaust valve 75 therein, and the external atmosphere communicating pipe 74 has an openable/closable relief valve 76 therein. The exhaust valve 75 and the relief valve 76 are operated collaboratively so as to adjust the pressure in the chamber 70 to any pressure from atmospheric pressure to a desired degree of vacuum.

Figure 4:
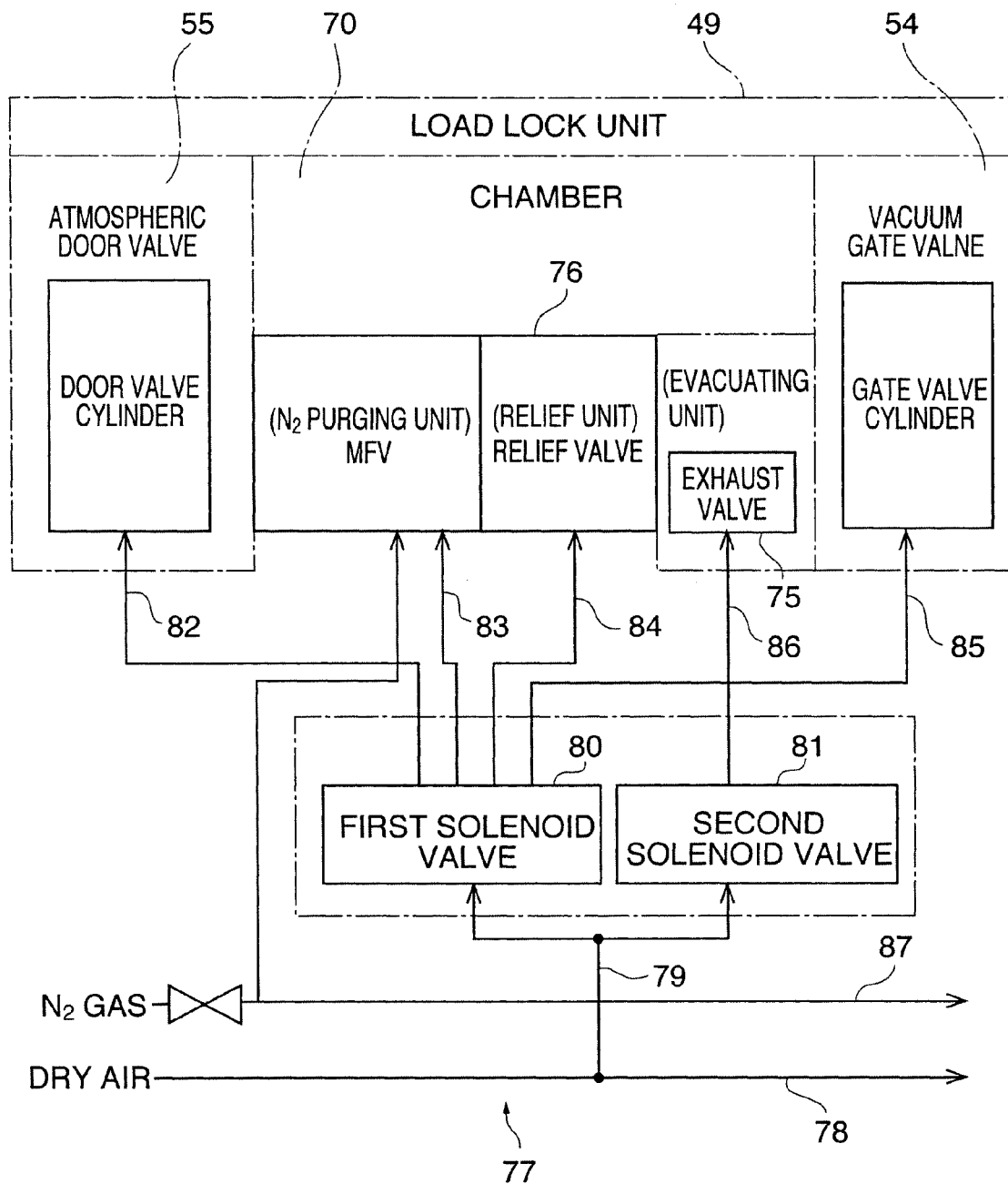
FIG. 4 is a diagram schematically showing the construction of a unit-driving dry air supply system for a second load lock unit appearing in FIG. 3.

FIG. 4 is a diagram schematically showing the construction of a unit-driving dry air supply system for the second load lock unit appearing in FIG. 3.

As shown in FIG. 4, dry air from the unit-driving dry air supply system 77 for the second load lock unit 49 is supplied to a door valve cylinder for driving a sliding door of the atmospheric door valve 55, the MFC in the nitrogen gas supply pipe 71 as an $N_2$ purging unit, the relief valve 76 in the external atmosphere communicating pipe 74 as a relief unit for releasing to the external atmosphere, the exhaust valve 75 in the second load lock unit exhaust system 73 as an evacuating unit, and a gate valve cylinder for driving a sliding gate of the vacuum gate valve 54.

The unit-driving dry air supply system 77 has an auxiliary dry air supply pipe 79 that branches off from a main dry air supply pipe 78 of the second process ship 12, and a first solenoid valve 80 and a second solenoid valve 81 that are connected to the auxiliary dry air supply pipe 79.

The first solenoid valve 80 is connected respectively to the door valve cylinder, the MFC, the relief valve 76, and the gate valve cylinder by dry air supply pipes 82, 83, 84, and 85, and controls operation of these elements by controlling the amount of dry air supplied thereto. Moreover, the second solenoid valve 81 is connected to the exhaust valve 75 by a dry air supply pipe 86, and controls operation of the exhaust valve 75 by controlling the amount of dry air supplied to the exhaust valve 75.

The MFC in the nitrogen gas supply pipe 71 is also connected to a nitrogen ($N_2$) gas supply system 87.

The second processing unit 34 and the third processing unit 36 also each has a unit-driving dry air supply system having a similar construction to the unit-driving dry air supply system 77 for the second load lock unit 49 described above.

Returning to FIG. 1, the substrate processing apparatus 10 has a system controller for controlling operations of the first process ship 11, the second process ship 12 and the loader unit 13, and an operation controller 88 that is disposed at one end of the loader unit 13 in the longitudinal direction of the loader unit 13.

The operation controller 88 has a display section comprised of, for example, an LCD (liquid crystal display), for displaying the state of operation of the component elements of the substrate processing apparatus 10. A user can carry out various operations on the substrate processing apparatus 10 via the operation controller 88.

Figure 5:
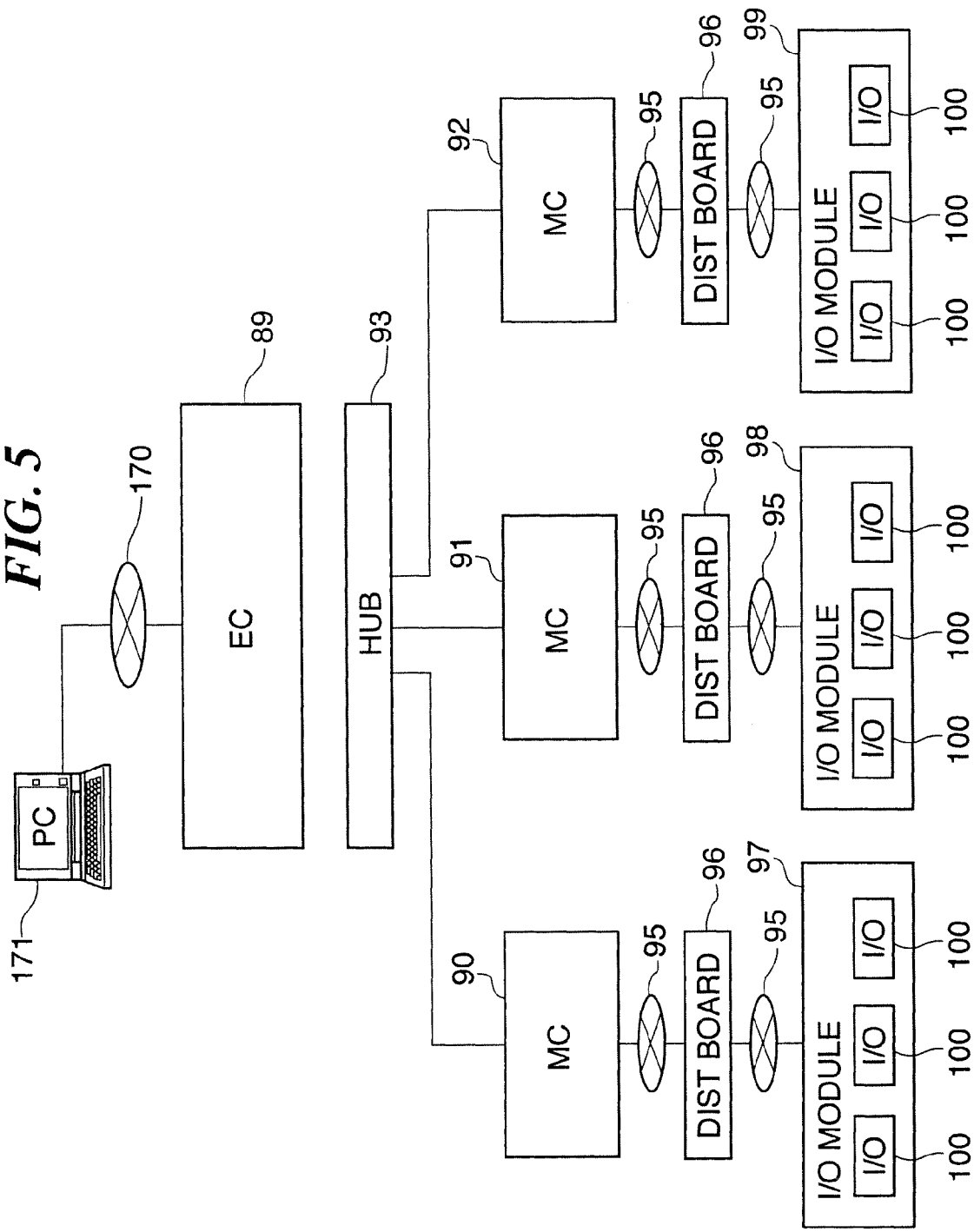
FIG. 5 is a diagram schematically showing the construction of a system controller for the substrate processing apparatus shown in FIG. 1.

Moreover, as shown in FIG. 5, the system controller is comprised of an EC (equipment controller) 89, three MC's (module controllers) 90, 91 and 92, and a switching hub 93 that connects the EC 89 to each of the MC's. The EC 89 of the system controller is connected via a LAN (local area network) 170 to a PC 171, which is an MES (manufacturing execution system) that carries out overall control of the manufacturing processes in the manufacturing plant in which the substrate processing apparatus 10 is installed. In collaboration with the system controller, the MES feeds back real real-time data on the processes in the manufacturing plant to a basic work system (not shown), and makes decisions relating to the processes in view of the overall load on the manufacturing plant and so on.

The EC 89 is a main controller (master controller) that controls the MC's and carries out overall control of the operation of the substrate processing apparatus 10. The EC 89 has a CPU, a RAM, a ROM, an HDD and so on. The CPU sends control signals to the MC's in accordance with programs corresponding to wafer W processing methods, i.e. recipes, specified by the user using the operation controller 88, thus controlling the operations of the first process ship 11, the second process ship 12 and the loader unit 13.

The switching hub 93 switches which MC is connected to the EC 89 in accordance with the control signals from the EC 89.

The MC's 90, 91 and 92 are auxiliary controllers (slave controllers) that control the operations of the first process ship 11, the second process ship 12, and the loader unit 13 respectively. Each of the MC's is connected respectively to an I/O (input/output) module 97, 98 or 99 through a DIST (distribution) board 96 via a GHOST network 95. Each GHOST network 95 is a network that is realized through an LSI known as a GHOST (general high-speed optimum scalable transceiver) on an MC board of the corresponding MC. A maximum of 31 I/O modules can be connected to each GHOST network 95; with respect to the GHOST network 95, the MC is the master, and the I/O modules are slaves.

The I/O module 98 is comprised of a plurality of I/O units 100 that are connected to component elements (hereinafter referred to as "end devices") of the second process ship 12, and transmits control signals to the end devices and output signals from the end devices. Examples of the end devices connected to the I/O units 100 of the I/O module 98 are: in the second processing unit 34, the MFC in the ammonia gas supply pipe 57, the MFC in the hydrogen fluoride gas supply pipe 58, the pressure gauge 59, and the APC valve 42; in the third processing unit 36, the MFC in the nitrogen gas supply pipe 65, the pressure gauge 66, the APC valve 69, the buffer arm 52, and the stage heater 51; in the second load lock unit 49, the MFC in the nitrogen gas supply pipe 71, the pressure gauge 72, and the second transfer arm 37; and in the unit-driving dry air supply system 77, the first solenoid valve 80, and the second solenoid valve 81.

Each of the I/O modules 97 and 99 has a similar construction to the I/O module 98. Moreover, the connection between the I/O module 97 and the MC 90 for the first process ship 11, and the connection between the I/O module 99 and the MC 92 for the loader unit 13 are constructed similarly to the connection between the I/O module 98 and the MC 91 described above, and hence description thereof is omitted.

Each GHOST network 95 is also connected to an I/O board (not shown) that controls input/output of digital signals, analog signals and serial signals to/from the I/O units 100.

In the substrate processing apparatus 10, when carrying out the COR processing on a wafer W, the CPU of the EC 89 implements the COR processing in the second processing unit 34 by sending control signals to desired end devices via the switching hub 93, the MC 91, the GHOST network 95, and the I/O units 100 of the I/O module 98, in accordance with a program corresponding to a recipe for the COR processing.

Specifically, the CPU sends control signals to the MFC in the ammonia gas supply pipe 57 and the MFC in the hydrogen fluoride gas supply pipe 58 so as to adjust the volumetric flow rate ratio between the ammonia gas and the hydrogen fluoride gas in the chamber 38 to a desired value, and sends control signals to the TMP 41 and the APC valve 42 so as to adjust the pressure in the chamber 38 to a desired value. Moreover, at this time, the pressure gauge 59 sends the value of the pressure in the chamber 38 to the CPU of the EC 89 in the form of an output signal, and the CPU determines control parameters for the MFC in the ammonia gas supply pipe 57, the MFC in the hydrogen fluoride gas supply pipe 58, the APC valve 42, and the TMP 41 based on the sent value of the pressure in the chamber 38.

Moreover, when carrying out the PHT processing on a wafer W, the CPU of the EC 89 implements the PHT processing in the third processing unit 36 by sending control signals to desired end devices in accordance with a program corresponding to a recipe for the PHT processing.

Specifically, the CPU sends control signals to the MFC in the nitrogen gas supply pipe 65, and the APC valve 69 so as to adjust the pressure in the chamber 50 to a desired value, and sends control signals to the stage heater 51 so as to adjust the temperature of the wafer W to a desired temperature. Moreover, at this time, the pressure gauge 66 sends the value of the pressure in the chamber 50 to the CPU of the EC 89 in the form of an output signal, and the CPU determines control parameters for the APC valve 69, and the MFC in the nitrogen gas supply pipe 65 based on the sent value of the pressure in the chamber 50.

According to the system controller shown in FIG. 5, the plurality of end devices are not directly connected to the EC 89, but rather the I/O units 100 which are connected to the plurality of end devices are modularized to form the I/O modules, and each I/O module is connected to the EC 89 via an MC and the switching hub 93. As a result, the communication system can be simplified.

Moreover, each of the control signals sent by the CPU of the EC 89 contains the address of the I/O unit 100 connected to the desired end device, and the address of the I/O module containing that I/O unit 100. The switching hub 93 thus refers to the address of the I/O module in the control signal, and then the GHOST of the appropriate MC refers to the address of the I/O unit 100 in the control signal, whereby the need for the switching hub 93 or the MC to ask the CPU for the destination of the control signal can be eliminated, and hence smoother transmission of the control signals can be realized.

Figure 6:
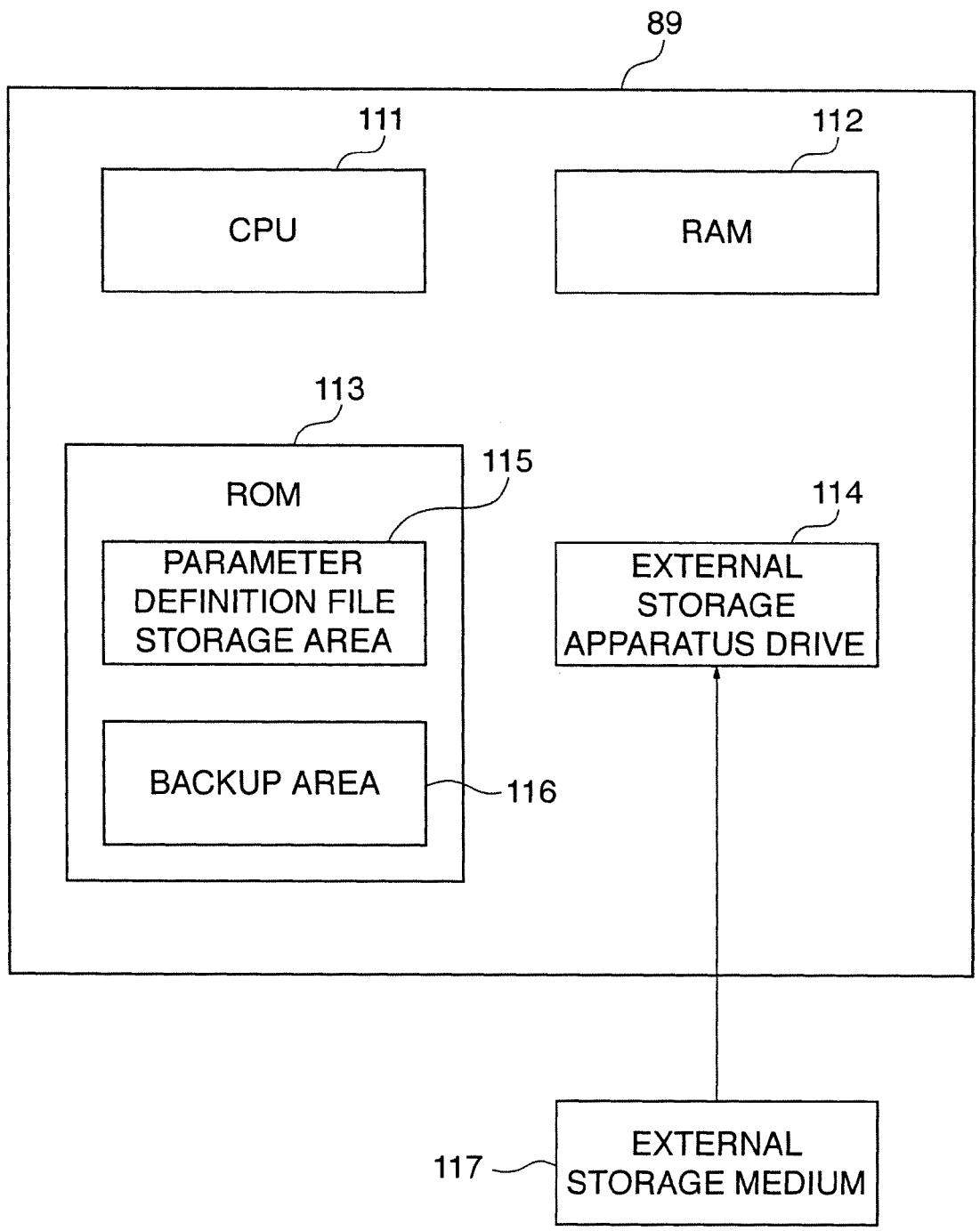
FIG. 6 is a block diagram schematically showing the construction of an EC in the system controller shown in FIG. 5.

FIG. 6 is a block diagram schematically showing the construction of the EC 89 in the system controller shown in FIG. 5.

As shown in FIG. 6, the EC 89 is comprised of a CPU 111 that controls the component elements of the substrate processing apparatus 10, a RAM 112 as a work area for computational processing carried out by the CPU 111, a ROM 113 as a storage area, and an external storage apparatus drive 114 that reads data from and writes data to an external storage apparatus such as an HD, a floppy (registered trademark) disk, an MO, or a CD-ROM.

The ROM 113 has stored therein programs specifying recipes for the various types of processing implemented in the chamber 10 as described above, and various control parameters for controlling the component elements in accordance with the recipes. The ROM 113 has therein a parameter definition file storage area 115 in which parameter definition files, described below, are stored, and a backup area 116 for creating backup files. Moreover, the ROM 113 also has a parameter category changing tool, described below, stored therein.

In the EC 89, as described above, the CPU 111 reads out from the ROM 113 and executes programs corresponding to recipes for each of the types of processing, and searches corresponding control parameters from the ROM 113 in accordance with the state of the component elements, and controls the end devices by outputting the control parameters to the end devices as control signals, thus implementing each of the types of processing.

The ROM 113 has stored therein a large number of control parameters for controlling the component elements of the chamber 10. The control parameters include gas supply amounts for the MFC in the ammonia gas supply pipe 57, the MFC in the hydrogen fluoride gas supply pipe 58, the MFC in the nitrogen gas supply pipe 65, and so on.

Attributes of the control parameters are defined through a parameter definition file. Attribute data for each of the parameters includes parameter ID data (hereinafter referred to as the "GPID") for identifying the parameter, category data indicating a category to which the parameter belongs, choice data indicating choices set for the parameter, and text data for displaying the item name of, category of, and choices for the parameter on the operation controller 88. The category to which each parameter belongs indicates the importance of that parameter, there being, for example, five categories, that is category 0, 1, 2, 3, and 4. In the present embodiment, the lower the category, the higher the importance of the parameter.

As shown in FIG. 7, the parameter definition file has stored therein data showing the name of the parameter definition file (the parameter definition file name), and the GPIDs, category data, text data, and choice data. In the parameter definition file, the attribute data can be set for a plurality of the control parameters. The parameter definition file is stored in the parameter definition file storage area 115 of the ROM 113. The values of the parameters are not recorded in the parameter definition file, but rather are stored in a predetermined area of the ROM 113. The relationship between the parameter values and the parameter definition file is given by the GPIDs.

As shown in FIG. 8, the text data and choices in the parameter definition file are displayed on the operation controller 88. On a parameter definition file data display screen on the operation controller 88 shown in FIG. 8, the item name and category of each of the parameters are displayed in an item name column 121, and the choice set for each of the parameters is displayed in a choice column 122. In the item name column 121, the number displayed to the left of each item name indicates the category to which that parameter belongs. For example, the item name of the parameter displayed in the uppermost row of the parameter definition file data display screen is "ARAMS state forced change", and the category is 4. Moreover, "off" has currently been selected as the parameter value for "ARAMS state forced change". The "ARAMS state forced change" parameter is thus currently set to "off". Moreover, the item name of the parameter displayed in the second row of the parameter definition file data display screen is "PAC (Process Automation Control) recipe inform time-out", and the category is 3. Moreover, "10 (seconds)" has currently been selected as the parameter value for "PAC recipe inform time-out". Note that PAC includes R2R and FDC.

The EC 89 is constructed such that parameters of high category, i.e. low importance, in the present embodiment parameters belonging to the categories 2, 3 and 4, can be set to any chosen value by the user via the operation controller 88. On the other hand, the 89 is constructed such that parameters of low category, i.e. high importance, in the present embodiment parameters belonging to the categories 0 and 1, cannot be changed by the user. As a result, safety is secured with regard to parameter changing.

Specifically, for each of the parameters belonging to the categories 2, 3 and 4, the choices and the parameter value can be changed on the parameter definition file data display screen shown in FIG. 8. On the other hand, for the parameters belonging to the categories 0 and 1, the choices and the parameter value cannot be changed. Note that changing of a parameter is carried out by the CPU 111 executing a parameter changing program stored in the ROM 113 upon an operation by the user. The parameter definition file stored in the ROM 113 is linked to the parameter changing program, and hence when the CPU 111 executes the parameter changing program, the parameter definition file (FIG. 7) in the ROM 113 is referred to, and the parameter specified by the user is made to be changeable in the case that that parameter belongs to category 2, 3 or 4.

As described above, the EC 89 is made to be such that the value of any parameter whose category is set to 0 or 1 cannot be changed, whereby safety is secured with regard to parameter changing. However, it is inconvenient for the user not to be able to change parameters whose category is 0 or 1. To counteract this problem, the substrate processing apparatus 10 is constructed such that a parameter category changing process, described below with reference to FIG. 10, can be carried out. Specifically, a program for carrying out the parameter category changing process (a parameter category changing tool) is stored in the ROM 113 of the EC 89.

An external storage medium 117 having stored therein a category change definition file indicating parameters of which the category is desired to be changed is inserted into the external storage apparatus drive 114, for carrying out the parameter category changing process so that parameters belonging to category 0 or 1 can be changed. As shown in FIG. 9, the category change definition file stored on the external storage medium 117 has stored therein parameter definition file names and GPIDS of parameters for which it is desired to increase the category so as to make the parameter value freely changeable by the user via the operation controller 88. The category change definition file is constructed such that one GPID or more can be recorded therein. The CPU 111 reads in the category change definition file stored in the external storage medium 117 via the external storage apparatus drive 114 in response to an operation by the user, and stores the category change definition file in the ROM 113.

Following is a detailed description of the parameter category changing process.

Figure 10A:
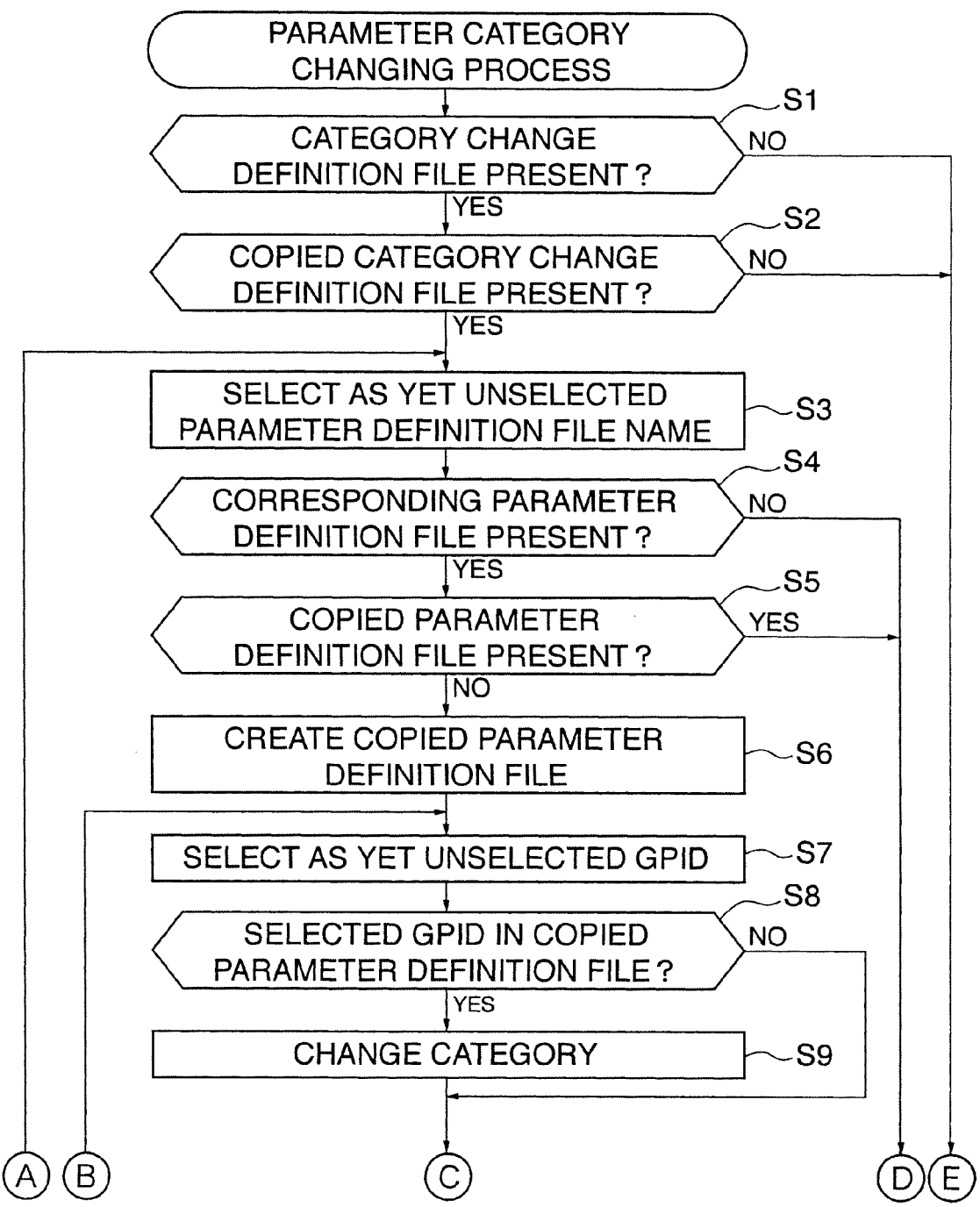
FIG. 10 is a flowchart of a parameter category changing process carried out by the substrate processing apparatus shown in FIG. 1.
Figure 10B:
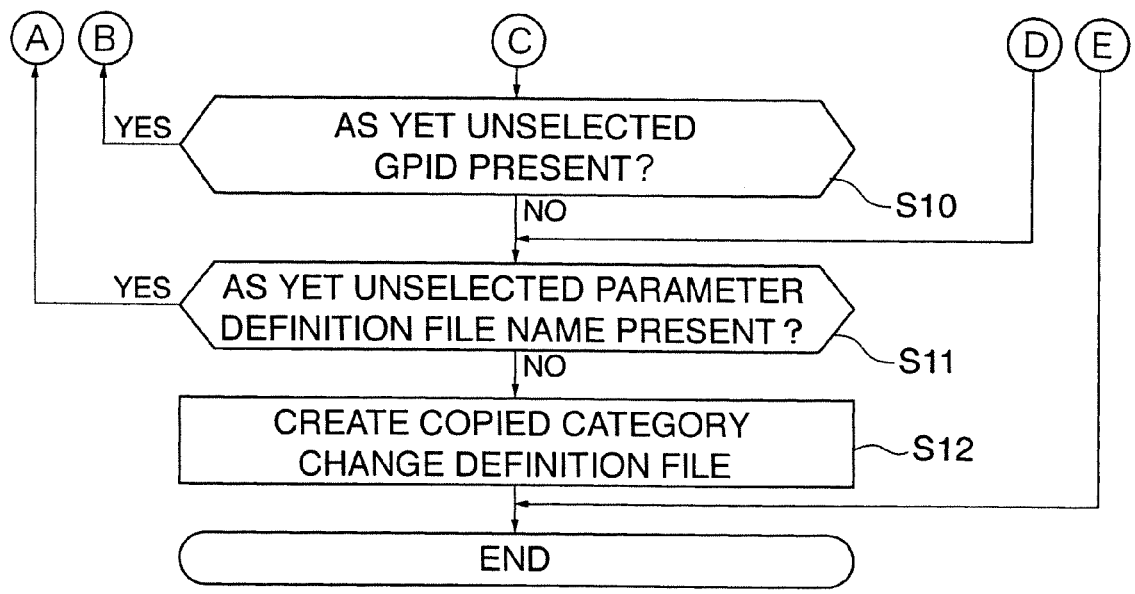

FIG. 10 is a flowchart of the parameter category changing process carried out by the substrate processing apparatus 10.

Figure 11:
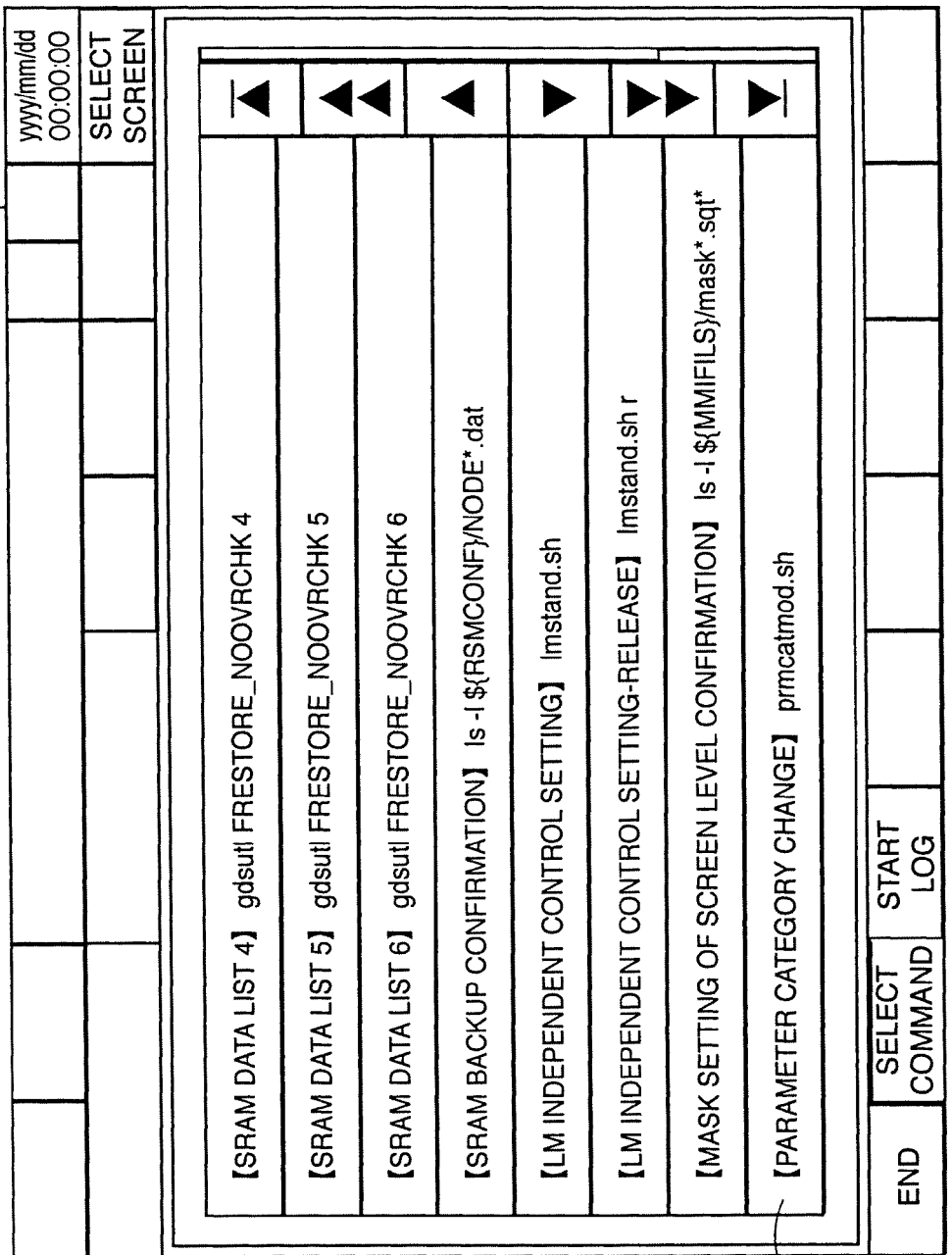
FIG. 11 is a drawing useful in explaining an operation for commencing the parameter category changing process shown in FIG. 10.

The parameter category changing process is carried out by the CPU 111 of the EC 89 upon the user carrying out a predetermined operation via the operation controller 88. Specifically, the user displays a parameter category changing process implementation screen as shown in FIG. 11 on the operation controller 88, and selects a parameter category change button 131 on the parameter category changing process implementation screen, whereby the parameter category changing process is commenced.

In the parameter category changing process, first, it is determined whether or not there is a category change definition file in the ROM 113 (step S1). In the case that there is no category change definition file in the ROM 113, the present process is ended. In the case that there is no category change definition file in the ROM 113, there is taken to be an error, and subsequent processing is not carried out. On the other hand, in the case that there is a category change definition file in the ROM 113, the processing of step S2 is moved to.

In step S2, it is determined whether or not a category change definition file (hereinafter referred to as a "copied category change definition file") created in step S12, described later, by copying the category change definition file in the ROM 113 is present in the backup area 116. In the case that there is a copied category change definition file in the backup area 116, the present process is ended. In the case that that there is a copied category change definition file in the backup area 116, there is taken to be an error, and subsequent processing is not carried out. On the other hand, in the case that there is no copied category change definition file in the backup area 116, the processing of step S3 is moved to.

In step S3, a parameter definition file name not yet selected in step S3 is selected from the parameter definition file names in the category change definition file in the ROM 113.

Next, a parameter definition file corresponding to the parameter definition file name selected in step S3 is searched for in the parameter definition file storage area 115 of the ROM 113, and it is determined whether or not this corresponding parameter definition file is in the parameter definition file storage area 115 (step S4). In the case that the corresponding parameter definition file is not in the parameter definition file storage area 115, the processing of step S11, described below, is moved to. That is, category changing for the parameter definition file corresponding to the parameter definition file name selected in step S3 is skipped. In this case, it is displayed on the operation controller 88 that the category changing for the parameter definition file corresponding to the selected parameter definition file name has been skipped.

On the other hand, in the case that the corresponding parameter definition file is in the parameter definition file storage area 115, it is determined whether or not a copy of this parameter definition file has already been copied into the backup area 116 (step S5). That is, it is determined whether or not there is a copy of the parameter definition file (hereinafter referred to as the "copied parameter definition file") in the backup area 116.

In the case that there is no copied parameter definition file in the backup area 116, the parameter definition file searched in step S4 is copied into the backup area 116 so as to create a copied parameter definition file in the backup area 116 (step S6), and then the processing of step S7 is moved to.

On the other hand, in the case that there is a copied parameter definition file in the backup area 116, the processing of step S11 is moved to. That is, in the case that there is a copied parameter definition file in the backup area 116 in step S5, categories in the corresponding parameter definition file have already been changed through the processing described below, and hence category changing for the subsequently searched parameter definition file is skipped. In this case, it is displayed on the operation controller 88 that this has been skipped.

In step S7, a GPID not yet selected in step S7 out of GPIDs corresponding to the parameter definition file name selected in step S3 is selected from the category change definition file read into the ROM 113 (step S7), and it is determined whether or not there is a GPID the same as the selected GPID in the copied parameter definition file created in the backup area 116 in step S6 (step S8).

In the case that the GPID selected in step S7 is in the copied parameter definition file created in step S6, category data of category 0 or 1 for the parameter represented by this GPID in the copied parameter definition file is changed to category 2 (step S9), and then the processing of step S10 is moved to. At this time, the copied parameter definition file in which the category data has been changed to category 2 is linked to the parameter changing program in place of the original parameter definition file. As a result, when the parameter changing program is executed by the user after the present parameter category changing process has been carried out, the CPU 111 refers to the copied parameter definition file; the parameter specified through the category change definition file in the external storage medium 117 can thus be changed. On the other hand, in the case that the GPID selected in step S7 is not in the copied parameter definition file created in step S6, the processing of step S10 is moved to directly.

In step S10, it is determined whether or not a GPID not yet selected in step S7 out of the GPIDs corresponding to the parameter definition file name selected in step S3 is in the category change definition file in the ROM 113. In the case that there is an as yet unselected GPID in the category change definition file, the processing of step S7 is returned to, whereas in the case that there is no as yet unselected GPID in the category change definition file, it is determined whether or not a parameter definition file name not yet selected in step S3 is in the category change definition file in the ROM 113 (step S11).

In the case that there is an as yet unselected parameter definition file name in the category change definition file in the ROM 113, step S3 is returned to. On the other hand, in the case that there is no as yet unselected parameter definition file name in the category change definition file in the ROM 113, the category change definition file is copied into the backup area 116 of the ROM 113 so as to create a copied category change definition file in the backup area 116 (step S12), and then the present process is ended.

The present process is carried out for each category change definition file in the external storage medium 117 read into the ROM 113 by the external storage apparatus drive 114. Moreover, while the above parameter category changing process is being carried out, operations such as initializing the apparatus and moving to "maintain all" are prohibited.

Through the parameter category changing process described above, by GPIDs of parameters belonging to category 0 or 1 and a parameter definition file name therefor being specified in the category change definition file in the external storage medium 117, a copied parameter definition file in which the category of each of the parameters specified in the external storage medium 117 is changed to category 2 is created, and this copied parameter definition file is linked to the parameter changing program in place of the original parameter definition file. As a result, when the parameter changing program is executed by the user after the parameter category changing process has been carried out, the CPU 111 refers to the copied parameter definition file; the parameters specified through the category change definition file in the external storage medium 117 can thus then be changed by the user via the operation controller 88.

Figure 12:
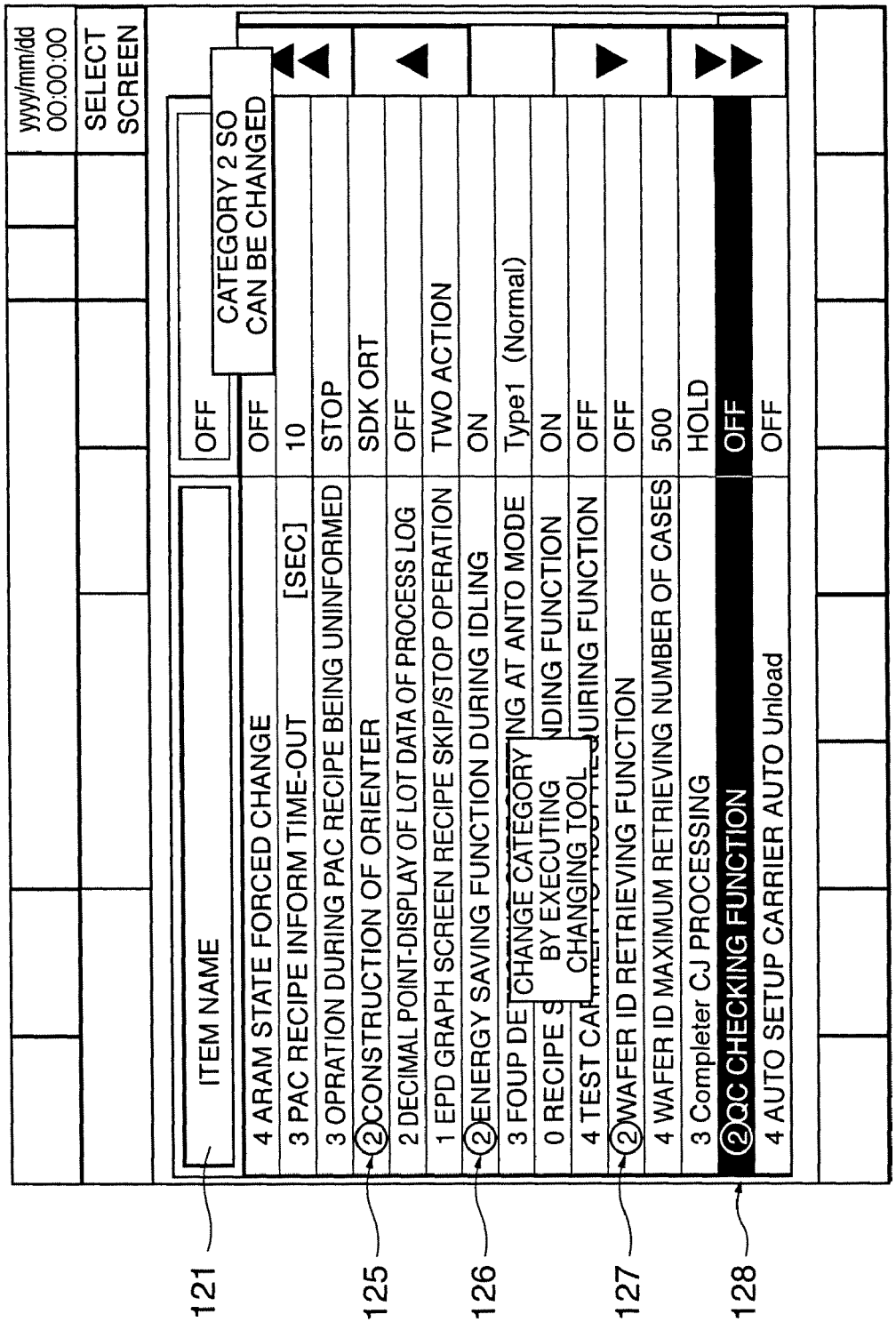
FIG. 12 is a drawing showing an example of parameter definition file data that has been changed through the parameter category changing process shown in FIG. 10.
Figure 13:
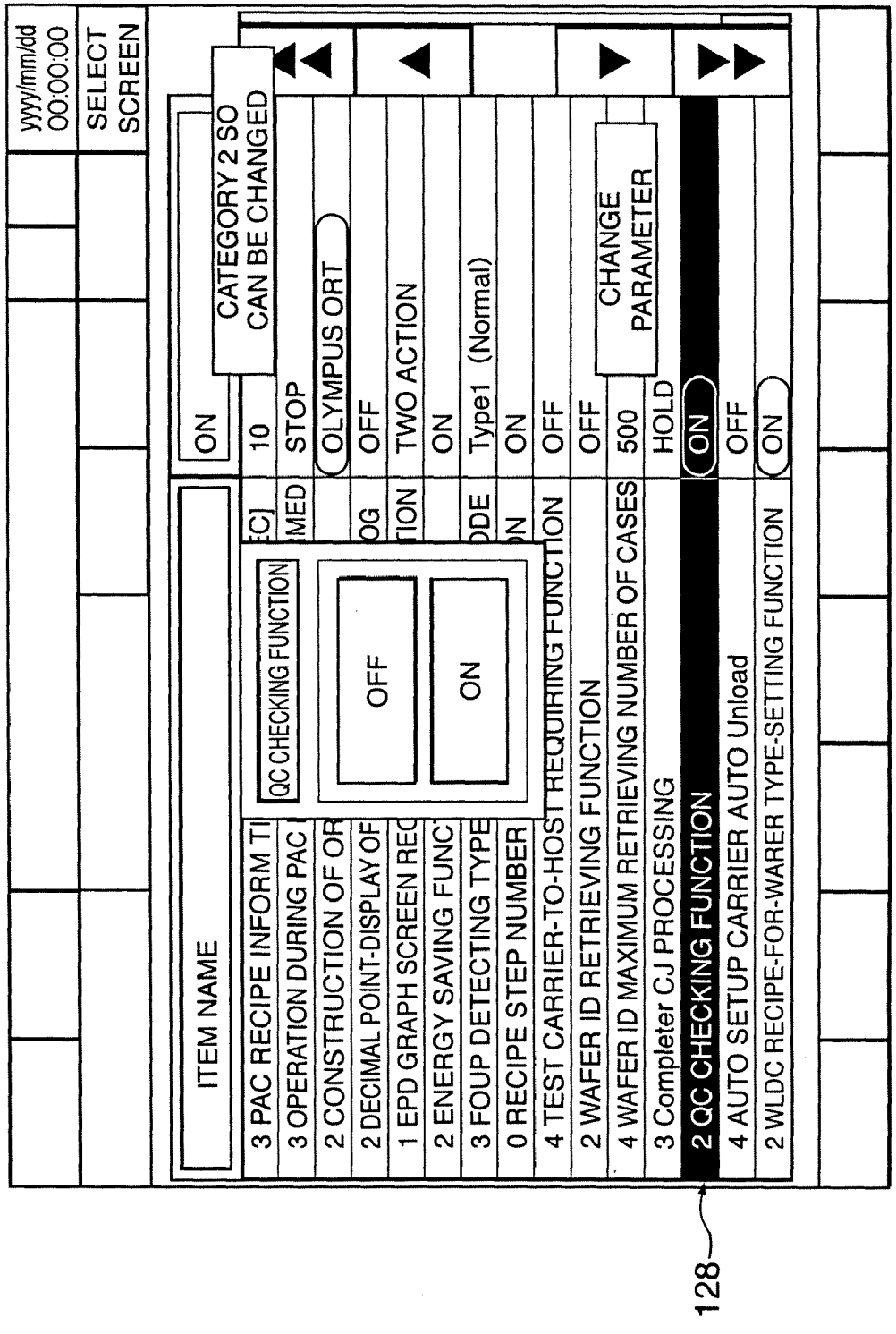
FIG. 13 is a drawing showing an example of an operation of changing a parameter that has become changeable through the parameter category changing process shown in FIG. 10.

For example, out of the parameters shown in FIG. 8, by writing a parameter definition file name and the GPIDs for parameters 125, 126, 127, and 128 for which the category is 0 or 1 into a category change definition file in the external storage medium 117 so as to specify the parameters 125, 126, 127, and 128 as parameters whose category is desired to be changed, reading the external storage medium 117 into the ROM 113 using the external storage apparatus drive 114, and carrying out the parameter category changing process shown in FIG. 10, the category of each of the specified parameters 125, 126, 127, and 128 is changed to category 2 (see FIG. 12). The user can thus then carry out the predetermined operation on the operation controller 88 to execute the parameter changing program, enabling the values of the specified parameters 125, 126, 127, and 128 to be changed easily via the operation controller 88. For example, as shown in FIG. 13, by selecting on the operation controller 88 the parameter 128 whose category has been changed (see FIG. 12), the choice thereof can be changed from "off" to "on".

In the processing of step S12 described above, out of category change definition files specifying parameters whose category is desired to be changed, a category change definition file for which the category of each of the specified parameters has already been changed to category 2 is copied into the backup area 116. Moreover, according to step S2, the parameter category changing process is not carried out on a category change definition file of which a copy has already been created in the backup area 116 in step S12. The parameter category changing process is thus prevented from being carried out twice on the same category change definition file.

Next, a description will be given of a parameter category restoring process for restoring the category of parameters whose category has been changed through the parameter category changing process described above back to the original category. The parameter category restoring process is carried out through the CPU 111 executing the parameter category changing tool.

Figure 14:
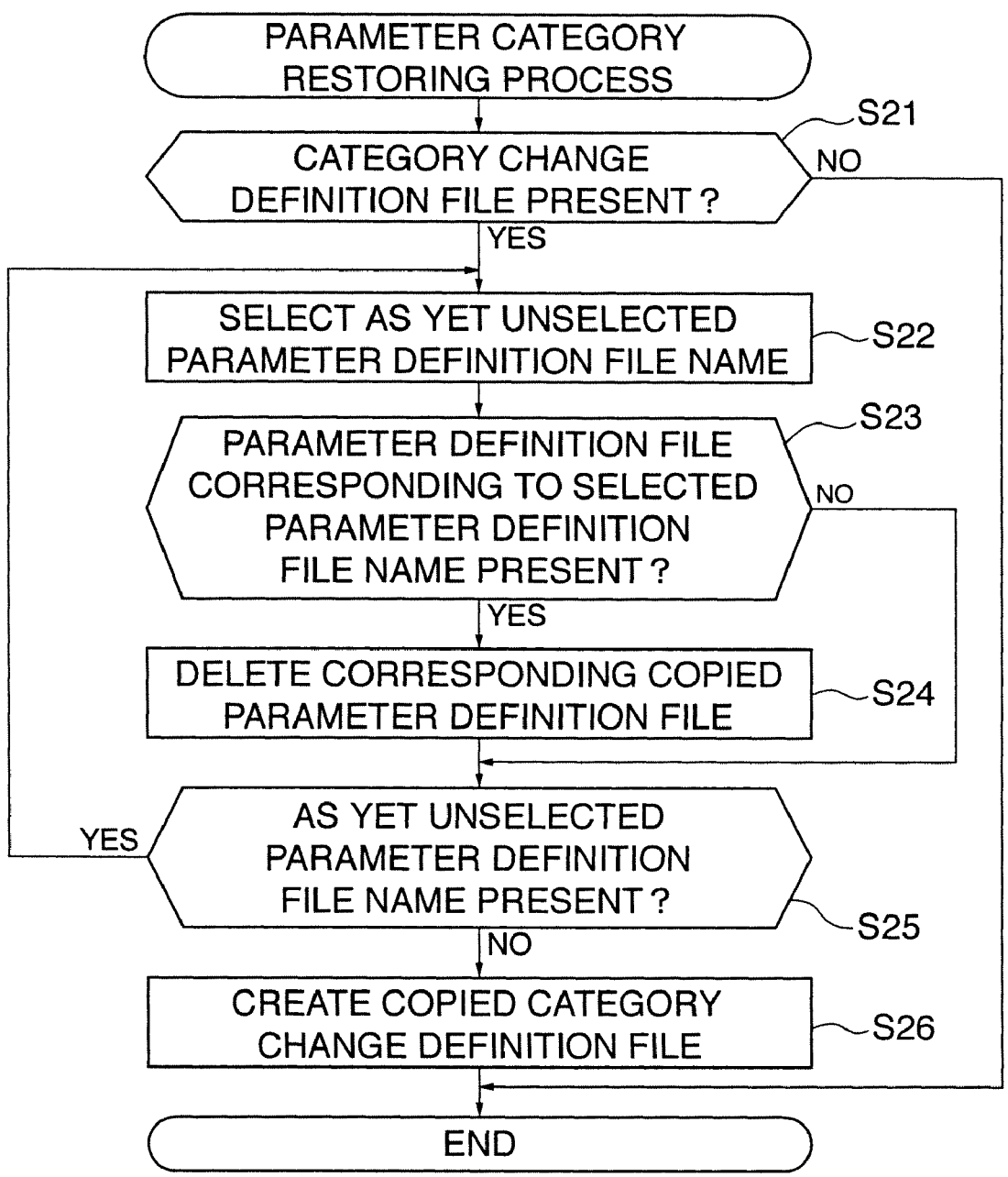
FIG. 14 is a flowchart of a parameter category restoring process carried out by the substrate processing apparatus shown in FIG. 1.

FIG. 14 is a flowchart of the parameter category restoring process.

The present process is carried out when the substrate processing apparatus 10 is restarted after the parameter category changing process shown in FIG. 10 described above has been carried out.

First, it is determined whether or not there is a copied category change definition file in the backup area 116 (step S21). In the case that there is no copied category change definition file in the backup area 116, the present process is ended. On the other hand, in the case that there is a copied category change definition file in the backup area 116, the processing of step S22 is moved to.

In step S22, a parameter definition file name that has not yet been selected in step S22 is selected from out of the parameter definition file names stored in the copied category change definition file, and it is determined whether or not there is a copied parameter definition file corresponding to the selected parameter definition file name in the backup area 116 (step S23). In the case that there is a copied parameter definition file corresponding to the selected parameter definition file name in the backup area 116, this copied parameter definition file is deleted (step S24), and the processing of step S25 is moved to. At this time, the link destination for the copied parameter changing program is changed from the copied parameter definition file to the original parameter definition file in the ROM 113. As a result, the category of each of the parameters whose category was changed to category 2 through the parameter category changing process shown in FIG. 10 so that the value of that parameter became changeable is restored to the original category 0 or 1, so that changing of each of these parameters again becomes impossible. On the other hand, in the case that a copied parameter definition file corresponding to the selected parameter definition file name is not in the backup area 116, the processing of step S25 is moved to directly. In this case, it is displayed on the operation controller 88 that category restoring processing has been skipped for a copied parameter definition file corresponding to the selected parameter definition file name.

In step S25, it is determined whether or not a parameter definition file name not yet selected in step S22 is in the copied category change definition file. In the case that there is an as yet unselected parameter definition file name in the copied category change definition file, step S22 is returned to. On the other hand, in the case that there is no as yet unselected parameter definition file name in the copied category change definition file, the copied category change definition file is deleted from the backup area 116 (step S26), and the present process is ended.

Through the present parameter category restoring process, the copied parameter definition file that was made to be the link destination of the parameter changing program through the parameter category changing process shown in FIG. 10 is deleted, and the original parameter definition file becomes the link destination. As a result, changing of the parameters specified in the external storage medium 117 again becomes impossible.

Moreover, the copied category change definition file that was created in the backup area 116 through the parameter category changing process shown in FIG. 10 is deleted, and hence it again becomes possible for the parameter category changing process to be carried out based on the category change definition file.

As described above, according to the substrate processing apparatus 10 of the present embodiment, parameter definition file names and GPIDs indicating parameters belonging to category 0 or 1 are recorded in a category change definition file in the external storage medium 117 so as to specify parameters whose value is desired to be changed, whereby the category of each of the specified parameters is changed to 2. As a result, the user can then change the values of the parameters. By specifying through the external storage medium 117 parameters having a category according to which the parameter cannot be changed, the user can thus easily change the parameters via the operation controller 88. Moreover, because the user can thus easily change the parameters, the occurrence of mistakes in the parameter changing can be reduced, and hence malfunctioning of the substrate processing apparatus 10 can be prevented.

In the parameter category changing process, a copy of the category change definition file for which the specified categories have been changed is created in the backup area 116, and carrying out the parameter category changing process based on this category change definition file then becomes impossible. The category changing can thus be prevented from being carried out a second time on parameters whose category has been changed. As a result, parameters that have become changeable can be prevented from becoming unchangeable again.

Moreover, according to the substrate processing apparatus 10, when the substrate processing apparatus 10 is restarted after the categories have been changed through the parameter category changing process, the parameter category restoring process is carried out so as to restore to the original categories the categories that were changed through the parameter category changing process. Forgetting to restore the changed categories to the original categories can thus be prevented. The risk of parameters being changed due to the state of the categories having been changed continuing can thus be reduced, and hence safety with regard to parameter changing can be strengthened.

Figure 15A:
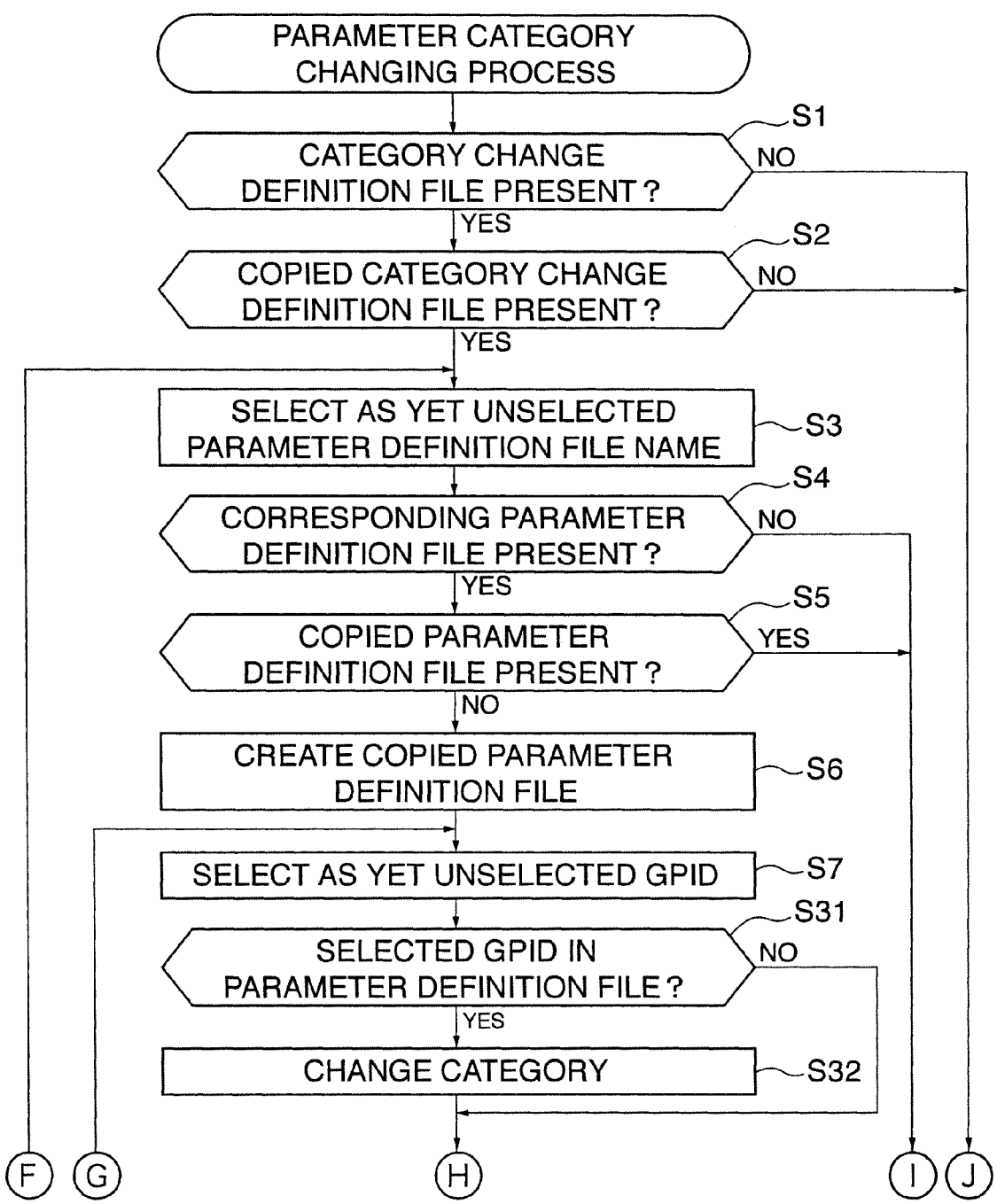
FIG. 15 is a flowchart of a variation of the parameter category changing process.
Figure 15B:
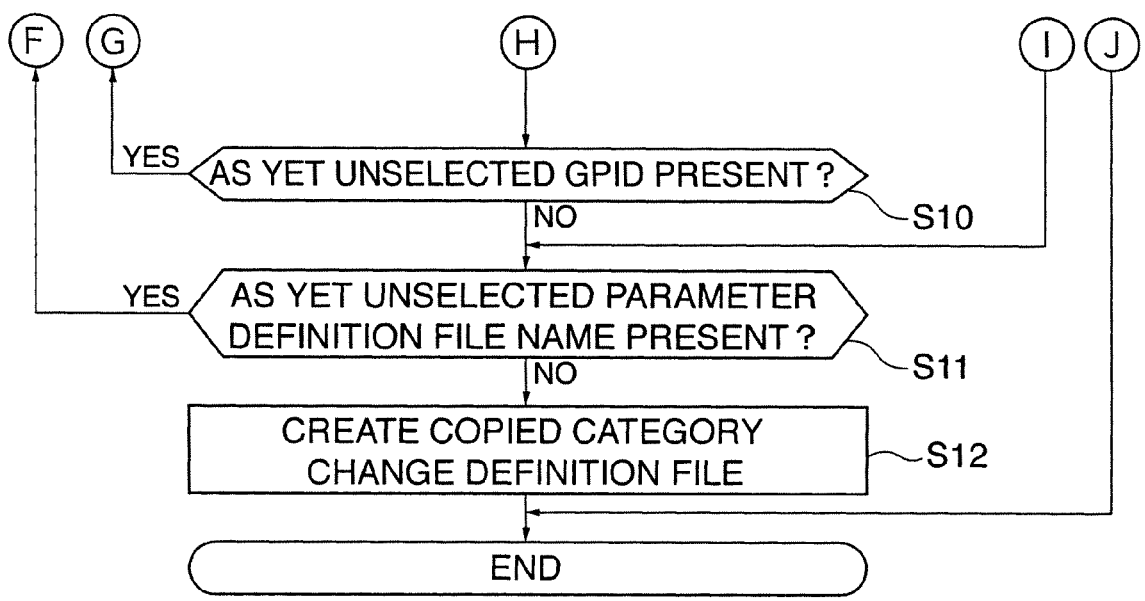
Figure 16:
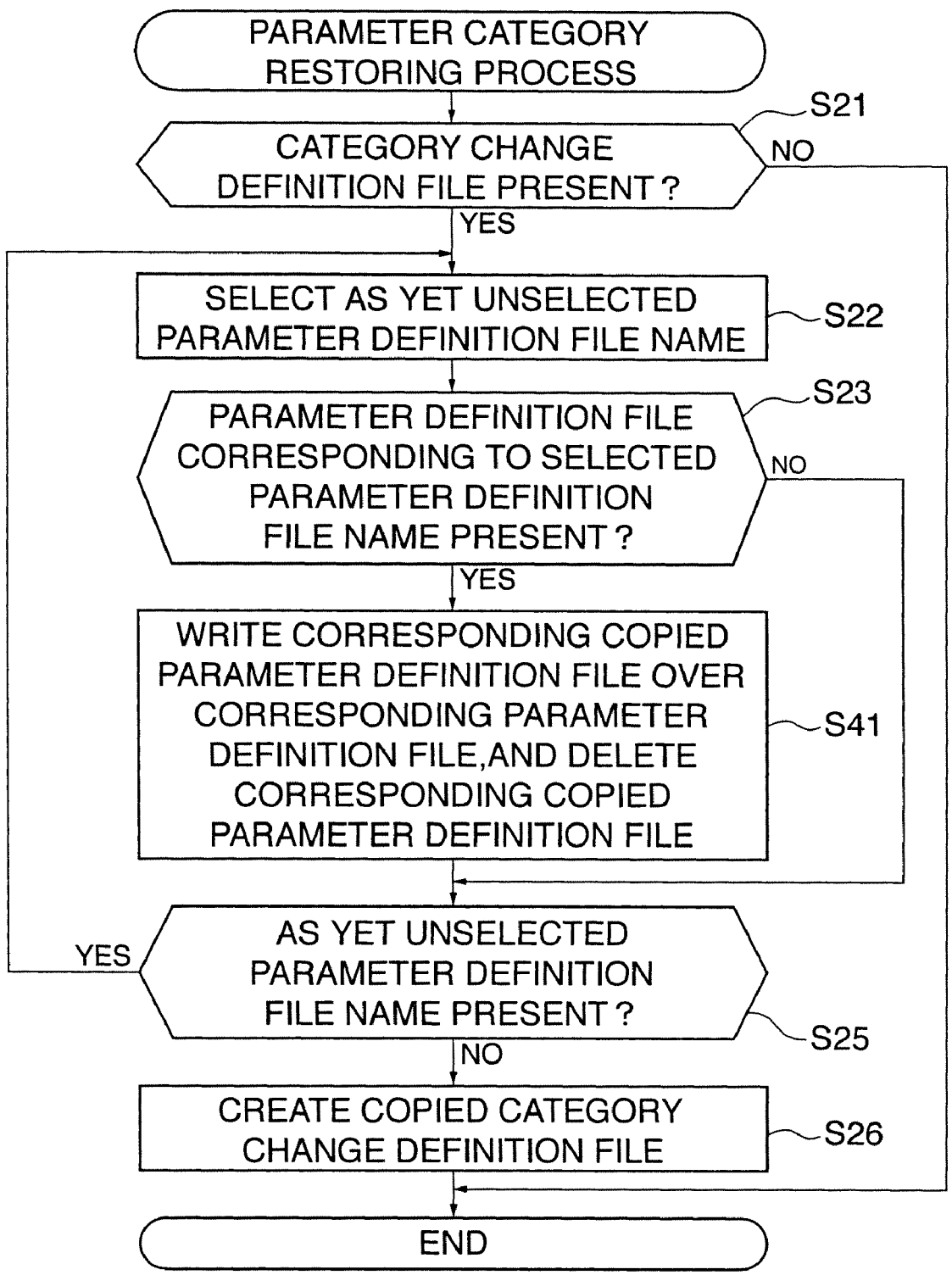
FIG. 16 is a flowchart of a variation of the parameter category restoring process.

Next, variations of the parameter category changing process and the parameter category restoring process will be described. FIG. 15 is a flowchart of a variation of the parameter category changing process, and FIG. 16 is a flowchart of a variation of the parameter category restoring process. In the following description, only parts different to the parameter category changing process shown in FIG. 10 and the parameter category restoring process shown in FIG. 14 are described, parts that are the same being designated by the same reference characters and repeated description being omitted.

First, the variation of the parameter category changing process will be described.

In the present parameter category changing process, instead of step S8 in the parameter category changing process shown in FIG. 10, it is determined whether or not there is a GPID the same as the GPID selected in step S7 in the parameter definition file stored in the parameter definition file storage area 115 of the ROM 113 (step S31). In the case that there is no GPID the same as the GPID selected in step S7 in the parameter definition file stored in the parameter definition file storage area 115, the processing of step S10 is moved to, whereas in the case that there is a GPID the same as the GPID selected in step S7 in the parameter definition file stored in the parameter definition file storage area 115, the processing of step S32, which is carried out instead of step S9 in the parameter category changing process shown in FIG. 10, is moved to. In step S32, in the parameter definition file in the parameter definition file storage area 115 having the GPID the same as the GPID selected in step S7, the category data for the parameter represented by the selected GPID is changed from category 0 or 1 to category 2.

As described above, compared with the parameter category changing process shown in FIG. 10, the present parameter category changing process differs in that the category data is changed not in the copied parameter definition file created in the backup area, but rather in the original parameter definition file stored in the parameter definition file storage area 115 of the ROM 113. As a result, the processing of changing the link destination of the parameter changing program can be omitted. Moreover, effects as for the parameter category changing process shown in FIG. 10 can be achieved.

Next, the variation of the parameter category restoring process will be described.

In the present parameter category restoring process, instead of step S24 in the parameter category restoring process shown in FIG. 14, the difference is that the copied parameter definition file in the backup area 116 is written over the corresponding parameter definition file in the parameter definition file storage area 115 (hereinafter referred to as the "corresponding parameter definition file"), and then the copied parameter definition file in the backup area 116 is deleted (step S41). As a result, the corresponding parameter definition file in the parameter definition file storage area 115 in which categories were changed through the parameter category changing process shown in FIG. 15 is overwritten with the copied parameter definition file which is a copy of the original parameter definition file from before the categories were changed through the parameter category changing process, and hence the parameter definition data in the parameter definition file storage area 115 is restored to the original data, whereby it becomes impossible to change parameters of category 0 or 1.

As described above, compared with the parameter category restoring process shown in FIG. 14, the present parameter category restoring process differs in that the copied parameter definition file that was created in the backup area is not deleted immediately, but rather the parameter definition file in which the category data has been changed stored in the parameter definition file storage area 115 of the ROM 113 is overwritten with the copied parameter definition file which is the original parameter definition file in which the category data is unchanged, and then the copied parameter definition file is deleted. As a result, the processing of changing the link destination of the parameter changing program can be omitted. Moreover, effects as for the parameter category restoring process shown in FIG. 14 can be achieved.

In the present invention, the structure of the substrate processing apparatus is not limited to the structure of the substrate processing apparatus 10 described above, but rather the substrate processing apparatus may have any of various structures.

The above-described embodiments are merely exemplary of the present invention, and are not be construed to limit the scope of the present invention.

The scope of the present invention is defined by the scope of the appended claims, and is not limited to only the specific descriptions in this specification. Furthermore, all modifications and changes belonging to equivalents of the claims are considered to fall within the scope of the present invention.

What is claimed is:

1. A substrate processing apparatus that carries out processing on a substrate, the substrate processing apparatus comprising:

a storage device that stores parameters for controlling the processing, the parameters configuring a plurality of components of the substrate processing apparatus, the parameters being categorized into a plurality of categories, each category determining whether corresponding parameters are enabled to be changed;

a control device that carries out the processing on the substrate based on the parameters;

a parameter changing device that enables each of the parameters to be changed in accordance with the corresponding category when functions are added or changed in the substrate processing apparatus;

a parameter category changing device that changes the category of a subset of the parameters when the functions are added or changed in the substrate processing apparatus; and a category change defining device that is detachable from the substrate processing apparatus and specifies the subset of parameters whose category is to be changed, wherein said parameter category changing device changes the category of each of the parameters specified by said category change defining device.

2. A substrate processing apparatus as claimed in claim 1, wherein said parameter changing device enables changing of ones of the parameters having a predetermined category out of the plurality of categories, and said parameter category changing device changes the category of ones of the parameters having a category other than the predetermined category.

3. A substrate processing apparatus as claimed in claim 1, wherein in response to the substrate processing device being restarted after the categories have been changed, said parameter category changing device restores each of the changed categories to an original category.

4. A substrate processing apparatus as claimed in claim 1, further comprising a parameter category change prohibiting device that, in response to said parameter category changing device having changed the category of each of the parameters specified by said category change defining device, prohibits changing of the categories by said parameter category changing device.

5. A substrate processing apparatus as claimed in claim 1, wherein said storage device stores parameter definition files, each including parameter data indicating each of the parameters, and category data indicating the category for each of the parameters out of the plurality of categories, and said parameter category changing device has a copy storage device, copies and stores in said copy storage device the parameter definition files, searches, from the copied parameter definition files, parameter data for the parameters specified by said category change defining device, and changes category data in the parameter definition files corresponding to the searched parameter data to enable changing of the parameters, and, in response to the substrate processing device being restarted, deletes the parameter definition files stored in said copy storage device to restore each of the changed categories to an original category.

6. A substrate processing apparatus as claimed in claim 1, wherein said storage device stores parameter definition files, each including parameter data indicating each of the parameters, and category data indicating the category for each of the parameters out of the plurality of categories, and said parameter category changing device has a copy storage device, copies and stores in said copy storage device the parameter definition files, searches, from the parameter definition files stored in said storage device, parameter data for the parameters specified by said category change defining device, and changes category data in a parameter definition file corresponding to the searched parameter data to enable changing of the parameters, and, in response to the substrate processing device being restarted, overwrites the parameter definition files stored in said storage device with the parameter definition files stored in said copy storage device so as to restore each of the changed categories to an original category.

7. A substrate processing apparatus as claimed in claim 1, wherein said parameter changing device has a user interface that enables the parameters to be changed by a user.

8. A substrate processing apparatus as claimed in claim 1, wherein said category change defining device enables the specified parameters to be changed.

9. A method for a substrate processing apparatus including a storage device that stores parameters categorized into a plurality of categories, and a control device that carries out processing on a substrate based on the parameters, the parameters configuring a plurality of components of the substrate processing apparatus, each of the categories determining whether corresponding parameters are to be changed, the method comprising:

specifying, in a category change defining device, parameters whose category is to be changed;

changing, at a parameter category changing device, the category of each of the parameters specified when functions are added or changed in the substrate processing apparatus; and enabling, in a parameter changing device, each of the parameters to be changed in accordance with a category corresponding thereto when the functions are added or changed in the substrate processing apparatus.

10. A computer-readable storage medium storing computer-readable instructions thereon for causing a computer to implement a parameter management method for a substrate processing apparatus comprising a storage device that stores parameters categorized into a plurality of categories, the parameters configuring a plurality of components of the substrate processing apparatus, and a control device that carries out processing on a substrate based on the parameters, the computer-readable instructions when executed by the computer cause the computer to perform the method comprising:

specifying parameters whose category is to be changed;

changing the category of each of the parameters specified when functions are added or changed in the substrate processing apparatus; and enabling each of the parameters to be changed in accordance with a category corresponding thereto when the functions are added or changed in the substrate processing apparatus.

11. A parameter management system for a substrate processing apparatus comprising a storage device that stores parameters categorized into a plurality of categories, the parameters configuring a plurality of components of the substrate processing apparatus, and a control device that carries out processing on a substrate based on the parameters, the parameter management system comprising:

a category change defining device that is detachable from the substrate processing apparatus and specifies a subset of parameters whose category is to be changed, wherein the substrate processing apparatus comprises a parameter changing device that enables each of the parameters to be changed in accordance with a corresponding category, and a parameter category changing device that changes the category of each of the parameters specified by said category change defining device.

12. A substrate processing apparatus that carries out processing on a substrate, the substrate processing apparatus comprising:

a storage device that stores parameters for controlling the processing, the parameters configuring a plurality of components of the substrate processing apparatus, the parameters being categorized into a plurality of categories;

a control device that carries out the processing on the substrate based on the parameters;

a parameter changing device that enables each of the parameters to be changed in accordance with a corresponding category;

a parameter category changing device that changes the category of a subset of the parameters; and a category restoring device that, in response to the substrate processing apparatus being restarted, restores each of the categories that have been changed by said parameter category changing device to an original category.

13. The substrate processing apparatus as claimed in claim 5, wherein the parameter definition files are stored in the storage device separately from the corresponding parameters.

* * * * *